(12) United States Patent
Zhu et al.

(10) Patent No.: US 11,043,505 B2
(45) Date of Patent: Jun. 22, 2021

(54) THREE-DIMENSIONAL MEMORY DEVICE HAVING MULTI-DECK STRUCTURE AND METHODS FOR FORMING THE SAME

(71) Applicant: YANGTZE MEMORY TECHNOLOGIES CO., LTD., Wuhan (CN)

(72) Inventors: Hongbin Zhu, Wuhan (CN); Juan Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/727,856

(22) Filed: Dec. 26, 2019

(65) Prior Publication Data

US 2021/0091102 A1 Mar. 25, 2021

Related U.S. Application Data

(63) Continuation of application No. PCT/CN2019/106947, filed on Sep. 20, 2019.

(51) Int. Cl.
*H01L 27/11556* (2017.01)
*H01L 25/065* (2006.01)
(Continued)

(52) U.S. Cl.
CPC .. *H01L 27/11556* (2013.01); *H01L 21/76802* (2013.01); *H01L 21/76831* (2013.01); *H01L 25/0657* (2013.01); *H01L 27/11582* (2013.01)

(58) Field of Classification Search
CPC .............................................. H01L 27/11563
See application file for complete search history.

(56) References Cited

U.S. PATENT DOCUMENTS

| 9,449,987 B1 | 9/2016 | Miyata et al. |
| 2015/0236038 A1 | 8/2015 | Pachamuthu et al. |

(Continued)

FOREIGN PATENT DOCUMENTS

| CN | 103681687 A | 3/2014 |
| CN | 106887435 A | 6/2017 |

(Continued)

OTHER PUBLICATIONS

International Search Report issued in corresponding International Application No. PCT/CN2019/106947, dated Jun. 28, 2020, 4 pages.

(Continued)

*Primary Examiner* — Yu-Hsi D Sun
(74) *Attorney, Agent, or Firm* — Bayes PLLC

(57) ABSTRACT

Embodiments of structure and methods for forming a three-dimensional (3D) memory device are provided. In an example, a 3D memory device includes a substrate, an alternating layer stack on the substrate, and a barrier structure extending vertically through the alternating layer stack. The alternating layer stack includes (i) an alternating dielectric stack having a plurality of dielectric layer pairs enclosed laterally by at least the barrier structure, and (ii) an alternating conductor/dielectric stack having a plurality of conductor/dielectric layer pairs. The 3D memory device also includes a channel structure and a source structure each extending vertically through the alternating conductor/dielectric stack, and a contact structure extending vertically through the alternating dielectric stack. The source structure includes at least one staggered portion along a respective sidewall.

17 Claims, 15 Drawing Sheets

(51) Int. Cl.
*H01L 21/768* (2006.01)
*H01L 27/11582* (2017.01)

(56) References Cited

U.S. PATENT DOCUMENTS

| | | | |
|---|---|---|---|
| 2016/0104715 A1 | 4/2016 | Pachamuthu et al. | |
| 2018/0197876 A1 | 7/2018 | Ge et al. | |
| 2018/0240811 A1* | 8/2018 | Kim | H01L 27/11514 |
| 2019/0081060 A1 | 3/2019 | Lu et al. | |
| 2020/0194450 A1* | 6/2020 | Pachamuthu | H01L 21/32134 |
| 2020/0402992 A1* | 12/2020 | Otsu | H01L 27/1157 |

FOREIGN PATENT DOCUMENTS

| | | |
|---|---|---|
| CN | 107771356 A | 3/2018 |
| CN | 107810552 A | 3/2018 |
| CN | 108461502 A | 8/2018 |
| CN | 108766971 A | 11/2018 |
| CN | 109075174 A | 12/2018 |
| CN | 109075175 A | 12/2018 |
| CN | 109314114 A | 2/2019 |
| CN | 109417075 A | 3/2019 |
| CN | 109473433 A | 3/2019 |
| CN | 109712987 A | 5/2019 |
| CN | 109904171 A | 6/2019 |
| CN | 110088906 A | 8/2019 |
| TW | 201834207 A | 9/2018 |

OTHER PUBLICATIONS

Written Opinion of the International Searching Authority issued in corresponding International Application No. PCT/CN2019/106947, dated Jun. 28, 2020, 4 pages.
International Search Report issued in corresponding International Application No. PCT/CN2019/106960, dated Jun. 23, 2020, 4 pages.
Written Opinion of the International Searching Authority issued in corresponding International Application No. PCT/CN2019/106960, dated Jun. 23, 2020, 4 pages.

\* cited by examiner

THREE-DIMENSIONAL MEMORY DEVICE HAVING MULTI-DECK STRUCTURE AND METHODS FOR FORMING THE SAME

CROSS-REFERENCE TO RELATED APPLICATIONS

This application is continuation of International Application No. PCT/CN2019/106947, filed on Sep. 20, 2019, entitled "THREE-DIMENSIONAL MEMORY DEVICE HAVING MULTI-DECK STRUCTURE AND METHODS FOR FORMING THE SAME," which is hereby incorporated by reference in its entirety. This application is also related to U.S. application Ser. No. 16/727,857, filed on Dec. 26, 2019, entitled "THREE-DIMENSIONAL MEMORY DEVICE HAVING MULTI-DECK STRUCTURE AND METHODS FOR FORMING THE SAME," which is hereby incorporated by reference in its entirety.

BACKGROUND

Embodiments of the present disclosure relate to three-dimensional (3D) memory devices, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices with multi-deck structures and methods for forming the 3D memory devices are provided.

In one example, a 3D memory device includes a substrate, an alternating layer stack on the substrate, and a barrier structure extending vertically through the alternating layer stack. The alternating layer stack includes (i) an alternating dielectric stack comprising a plurality of dielectric layer pairs enclosed laterally by at least the barrier structure, and (ii) an alternating conductor/dielectric stack comprising a plurality of conductor/dielectric layer pairs. In some embodiments, the 3D memory device also includes a channel structure and a source structure each extending vertically through the alternating conductor/dielectric stack and a contact structure extending vertically through the alternating dielectric stack. The source structure comprises at least one staggered portion along a respective sidewall.

In another example, a method for forming a 3D memory device includes the following operations. First, on a substrate, a first dielectric deck is formed to include a plurality of dielectric layer pairs, each of the plurality of dielectric layer pairs having a first dielectric layer and a second dielectric layer different from the first dielectric layer. A first slit opening portion is formed extending vertically through the first dielectric deck. A slit-sacrificial portion is in the first slit opening portion. On the first dielectric deck, a second dielectric deck is formed to include another plurality of dielectric layer pairs, each of the other plurality of dielectric layer pairs comprising another first dielectric layer and another second dielectric layer different from the other first dielectric layer. Further, a second slit opening portion is formed extending vertically through the second dielectric deck, the second slit opening portion exposing the slit-sacrificial portion. The slit-sacrificial portion is removed, the first slit opening portion and the second slit opening portion forming a slit opening. Further, a source structure is formed in the slit opening.

In a further example, a method for forming a 3D memory device includes the following operations. First, on a substrate, a first dielectric deck is formed to include a plurality of dielectric layer pairs, each of the plurality of dielectric layer pairs having a first dielectric layer and a second dielectric layer different from the first dielectric layer. A channel-sacrificial portion, a slit-sacrificial portion, a first contact portion, and a barrier-sacrificial portion are formed to each extend vertically through the first dielectric deck. The first barrier portion encloses the first contact portion and an inside portion the first dielectric deck. On the first dielectric deck, a second dielectric deck is formed to include another plurality of dielectric layer pairs, each of the other plurality of dielectric layer pairs having another first dielectric layer and another second dielectric layer different from the other first dielectric layer. Another channel-sacrificial portion, another slit-sacrificial portion, a second contact portion, and another barrier-sacrificial portion are formed to each extend vertically through the first dielectric deck. Further, the channel-sacrificial portion and the other channel-sacrificial portion are replaced with a channel structure, the slit-sacrificial portion and the other slit-sacrificial portion are replaced with a source structure, and the barrier-sacrificial portion and the other barrier-sacrificial portion are replaced with a barrier structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
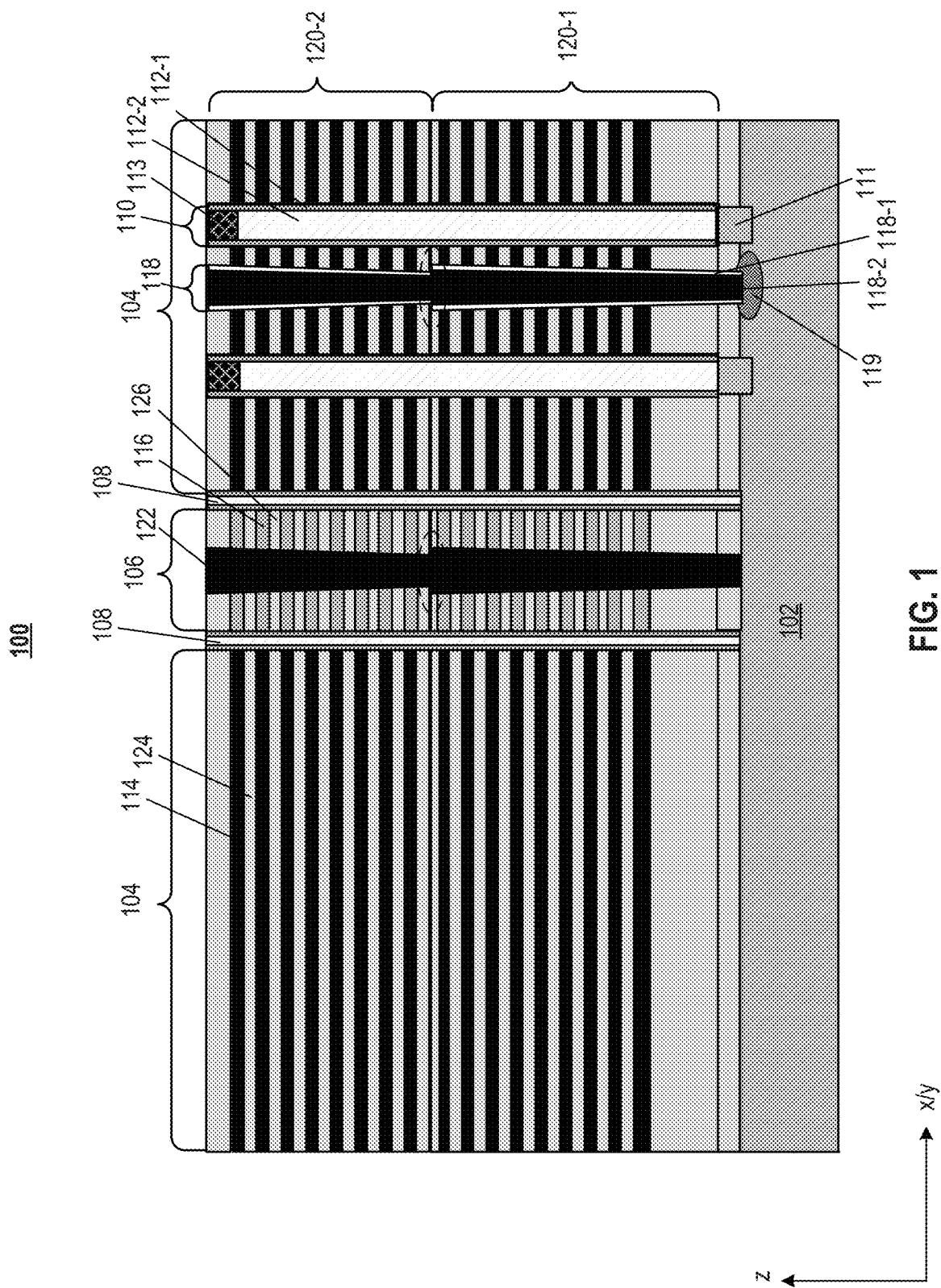
FIG. 1 illustrates a cross-sectional view of an exemplary 3D memory device having multi-deck structure, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "stair" refers to a vertical shift in the height of a set of adjoined surfaces. In the present disclosure, the term "stair" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a plurality of memory blocks. Adjacent memory blocks are often separated by a gate line slit (GLS), in which an array common source (ACS) is formed. In the fabrication method to form existing 3D NAND memory devices, GLSs are often formed by etching through the entire stack of conductor/dielectric layer pairs.

As the demand for higher memory capacity continues, 3D NAND memory devices with multi-deck structures have been proposed. Compared to existing 3D NAND memory devices, 3D NAND memory devices with multi-deck structures often have more levels (or conductor/dielectric layer pairs) along the vertical direction. Due to an increased number of levels, the existing etching method to form GLSs become challenging. For example, GLSs with undesirably high aspect ratios can be formed. The device material may also be difficult to fully remove due to a higher number of conductor/dielectric layer pairs along the vertical direction. The performance of the 3D NAND memory device can be affected.

The present disclosure provides a 3D memory device (e.g., 3D NAND memory device) having a multi-deck structure, and methods for forming the 3D memory device. The 3D memory device has a slit opening (e.g., a GLS) extending vertically in the 3D memory device. A source structure (e.g., an ACS) is formed in the slit opening. The 3D memory device can be formed by sequentially depositing a plurality of dielectric decks, and the slit opening can be formed by forming slit opening portions in each dielectric deck and jointly connecting the slit opening portions. The source structure can then be formed in the slit opening. A staggered portion can be formed between slit opening portions, e.g., at the interface of adjacent decks and along the sidewall of the slit opening. The formation of the slit opening and the source structure may thus be less impacted by the number of levels along the vertical direction.

In the present disclosure, other structures can also be formed by the same etching processes that forms the slit opening, e.g., to reduce the fabrication steps and/or the number of patterning masks. In some embodiments, channel holes, for forming channel structures, are formed by the same etching processes that form the slit opening. In some embodiments, contact openings for forming contact structures (e.g., through-array-contacts or TACs) and barrier openings for forming barrier structures surrounding the TACs are formed by the same etching processes that form the slit opening. Respective sacrificial structures may be formed and removed at desired fabrication stages in the slit openings, the channel holes, and the barrier openings for the formation of the contact structures, the barrier structures, the source structures, and the channel structures. To further reduce the fabrication steps, conductive materials are used for the formation of the sacrificial structures so that the contact structures can be formed without forming any sacrificial structures in the contact openings. The fabrication of the 3D memory device can be improved.

FIG. 1 illustrates a cross-sectional view of an exemplary 3D memory device 100 with a multi-deck structure, according to some embodiments. As shown in FIG. 1, 3D memory device 100 may include a substrate 102, and a stack structure 120 over substrate 102. Stack structure 120 may be an alternating layer stack that includes a first memory deck 120-1 and a second memory deck 120-2. 3D memory device 100 may include a barrier structure 108 extending vertically through stack structure 120, laterally separating stack structure 120 into an inside portion 106 and an outside portion 104. Barrier structure 108 may enclose inside portion 106, which include a plurality of dielectric pairs. A contact structure 122 (e.g., through array contact or TAC) may extend vertically through inside portion 106 of stack structure 120. A plurality of channel structures 110 and one or more source structures 118 (e.g., array common sources or ACSs) may be formed in outside portion 104, extending vertically through stack structure 120. The detailed descriptions of the structures are provided as follows.

Substrate 102 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Stack structure 120 may include a plurality of conductor layer 114 and dielectric layer 124 pairs in outside portion 104. The intersection of channel structures 110 and conductor layers 114 may form a plurality of memory cells. The plurality of conductor/dielectric layer pairs are also referred to as an "alternating conductor/dielectric stack." The number of the conductor/dielectric layer pairs in stack structure 120 (e.g., 32, 64, 96, or 128) determines the number of memory cells in 3D memory device 100. Conductor layers 114 and dielectric layers 124 in the alternating conductor/dielectric stack alternate in the vertical direction (e.g., the z-direction). In other words, except for the ones at the top or bottom of the alternating conductor/dielectric stack, each conductor layer 114 can be adjoined by two dielectric layers 124 on both sides, and each dielectric layer 124 can be adjoined by two conductor layers 114 on both sides. Conductor layers 114 can each have the same thickness or have different thicknesses. Similarly, dielectric layers 124 can each have the same thickness or have different thicknesses. Conductor layers 114 can include conductor materials including, but not limited to, tungsten (W), cobalt (Co), copper (Cu), aluminum (Al), polycrystalline silicon (polysilicon), doped silicon, silicides, or any combination thereof. Dielectric layers 124 can include dielectric materials including, but not limited to, silicon oxide, silicon nitride, silicon oxynitride, or any combination thereof. In some embodiments, conductor layers 114 include metal layers, such as W, and dielectric layers 124 include silicon oxide.

Channel structures 110 may form an array and may each extend vertically above substrate 102. Channel structure 110 can include a semiconductor channel extending vertically through the alternating conductor/dielectric stack. The semiconductor channel can include a channel hole filled with a channel-forming structure of a plurality of channel-forming layers, e.g., dielectric materials (e.g., as a memory film) and semiconductor materials (e.g., as a semiconductor layer). In some embodiments, the memory film is a composite layer including a tunneling layer, a memory layer (also known as a "charge trap layer"), and a blocking layer. For ease of illustration, the memory film and the semiconductor layer are together depicted as element 112-1. The remaining space of the channel hole of semiconductor channel can be partially or fully filled with a dielectric core 112-2 including dielectric materials, such as silicon oxide. The semiconductor channel can have a cylinder shape (e.g., a pillar shape) through stack structure 120 or have a staggered portion at the interface between adjacent decks (e.g., between first memory deck 120-1 and second memory deck 120-2 and along the sidewall of channel structure 110). The dielectric core, semiconductor layer, the tunneling layer, the memory layer, and the blocking layer are arranged radially from the center toward the outer surface of the pillar in this order, according to some embodiments. The semiconductor layer can include silicon, such as amorphous silicon, polysilicon, and/or single crystalline silicon. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 110 further includes a conductive plug 111 (e.g., a semiconductor plug) in the lower portion (e.g., at the lower end of bottom) of channel structure 110. As used herein, the "upper end" of a component (e.g., channel structure 110) is the end farther away from substrate 102 in the vertical direction, and the "lower end" of the component (e.g., channel structure 110) is the end closer to substrate 102 in the vertical direction when substrate 102 is positioned in the lowest plane of 3D memory device 100. Conductive plug 111 can include a semiconductor material, such as silicon, which is epitaxially grown from substrate 102 or deposited onto substrate 102 in any suitable directions. It is understood that in some embodiments, conductive plug 111 includes single crystalline silicon, the same material as substrate 102. In other words, conductive plug 111 can include an epitaxially-grown semiconductor layer grown from substrate 102. Conductive plug 111 can also include a different material than substrate 102. In some embodiments, conductive plug 111 includes at least one of silicon, germanium, and silicon germanium. In some embodiments, part of conductive plug 111 is above the top surface of substrate 102 and in contact with the semiconductor channel. Conductive plug 111 may be conductively connected to the semiconductor channel. In some embodiments, a top surface of conductive plug 111 is located between a top surface and a bottom surface of a bottom dielectric layer 124 (e.g., the dielectric layer at the bottom of stack structure 120).

In some embodiments, channel structure 110 further includes a drain structure 113 (e.g., channel plug) in the upper portion (e.g., at the upper end) of channel structure 110. Drain structure 113 can be in contact with the upper end of the semiconductor channel and may be conductively connected to the semiconductor channel Drain structure 113 can include semiconductor materials (e.g., polysilicon) or conductive materials (e.g., metals). In some embodiments, drain structure 113 includes an opening filled with Ti/TiN or Ta/TaN as an adhesion layer and tungsten as a conductor material. By covering the upper end of the semiconductor channel during the fabrication of 3D memory device 100, drain structure 113 can function as an etch stop layer to prevent etching of dielectrics filled in the semiconductor channel, such as silicon oxide and silicon nitride.

In some embodiments, source structure 118 extends vertically through the alternating conductor/dielectric stack and is in contact with substrate 102. Source structure 118 may include an insulating spacer 118-1 and a source contact 118-2 in insulating spacer 118-1. A doped region 119 may be formed in substrate 102 and in contact with source structure 118. Source contact 118-2 may be conductively connected to doped region 119 so that a source voltage can be applied through doped region 119 and source structure 118. Source structure 118 may include a plurality of source portions each extending in a respective memory deck (e.g., 120-1 or 120-2). The source portions, vertically aligned with one another (e.g., along the z-direction), may be in contact with and conductively connected to one another. The cross-section of each source portion along the x-z plane may have a trapezoid shape, of which a lateral dimension may decrease towards substrate 102. As shown in FIG. 1, source structure 118 may have a staggered portion at the interface of adjacent memory decks (120-1 and 120-2). The staggered portion may be along the sidewall of source structure 118. The staggered portion, formed by the difference in lateral dimensions of adjacent source portions, may include a lateral portion in contact with the ends of adjacent source portions. In some embodiments, insulating spacer 118-1 may include a suitable dielectric material such as silicon oxide. In some embodiments, source contact 118-2 may include a suitable conductive material such one or more of tungsten, polysilicon, doped silicon, silicides, aluminum, copper, and cobalt. For example, source contact 118-2 may include polysilicon in the source portion in first memory deck 120-1 and tungsten in the source portion in second memory deck 120-2. Doped region 119 may include suitable dopants with opposite polarity versus substrate 102.

Barrier structure 108 may fully enclose inside portion 106, which can also be referred to as a TAC region and/or an alternating dielectric stack. Barrier structure 108 may laterally separate stack structure 120 into the alternating conductor/dielectric stack and the alternating dielectric stack. That is, barrier structure 108 may be the boundary between the alternating conductor/dielectric stack and the alternating dielectric stack. In some embodiments, the alternating dielectric stack includes a plurality of alternating first dielectric layers 116 and second dielectric layers 126. Second dielectric layer 126 may be different from first dielectric layer 116. In some embodiments, first dielectric layer 116 and second dielectric layer 126 each includes silicon nitride and silicon oxide. Second dielectric layers 126 in the alternating dielectric stack can be the same as dielectric layers 124 in the alternating conductor/dielectric stack. In some embodiments, the number of dielectric layer pairs in the alternating dielectric stack is the same as the number of conductor/dielectric layer pairs in the alternating conductor/dielectric stack.

In some embodiments, barrier structure 108 is in a closed shape (e.g., a rectangle, a square, a circle, etc.) to completely enclose the alternating dielectric stack). A lateral dimension of barrier structure 108 may be less than a lateral dimension of channel structure 110 along the x-z plane. In some embodiments, barrier structure 108 may include one or more dielectric materials such as silicon oxide, silicon oxynitride, silicon nitride, high dielectric constant (high-k) dielectrics, arranged radially from the sidewall towards the center of barrier structure 108. Barrier structure 108 may insulate the alternating dielectric stack from the conductor/dielectric stack.

In some embodiments, contact structure 122 extends vertically through the alternating dielectric stack and is in contact with substrate 102. Contact structure 122 may include a plurality of contact portions each extending in a respective memory deck (e.g., 120-1 or 120-2). The contact portions, vertically aligned with one another (e.g., along the z-direction), may be in contact with and conductively connected to one another. The cross-section of each contact portion along the x-z plane may have a trapezoid shape, of which a lateral dimension may decrease towards substrate 102. As shown in FIG. 1, contact structure 122 may have a staggered portion at the interface of adjacent memory decks (120-1 and 120-2). The staggered portion may be along the sidewall of contact structure 122. The staggered portion, formed by the differences in lateral dimensions of adjacent contact portions, may include a lateral portion in contact with the ends of adjacent contact portions. In some embodiments, contact structure 122 may include a suitable conductive material such one or more of tungsten, polysilicon, doped silicon, silicides, aluminum, copper, and cobalt.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 2A:
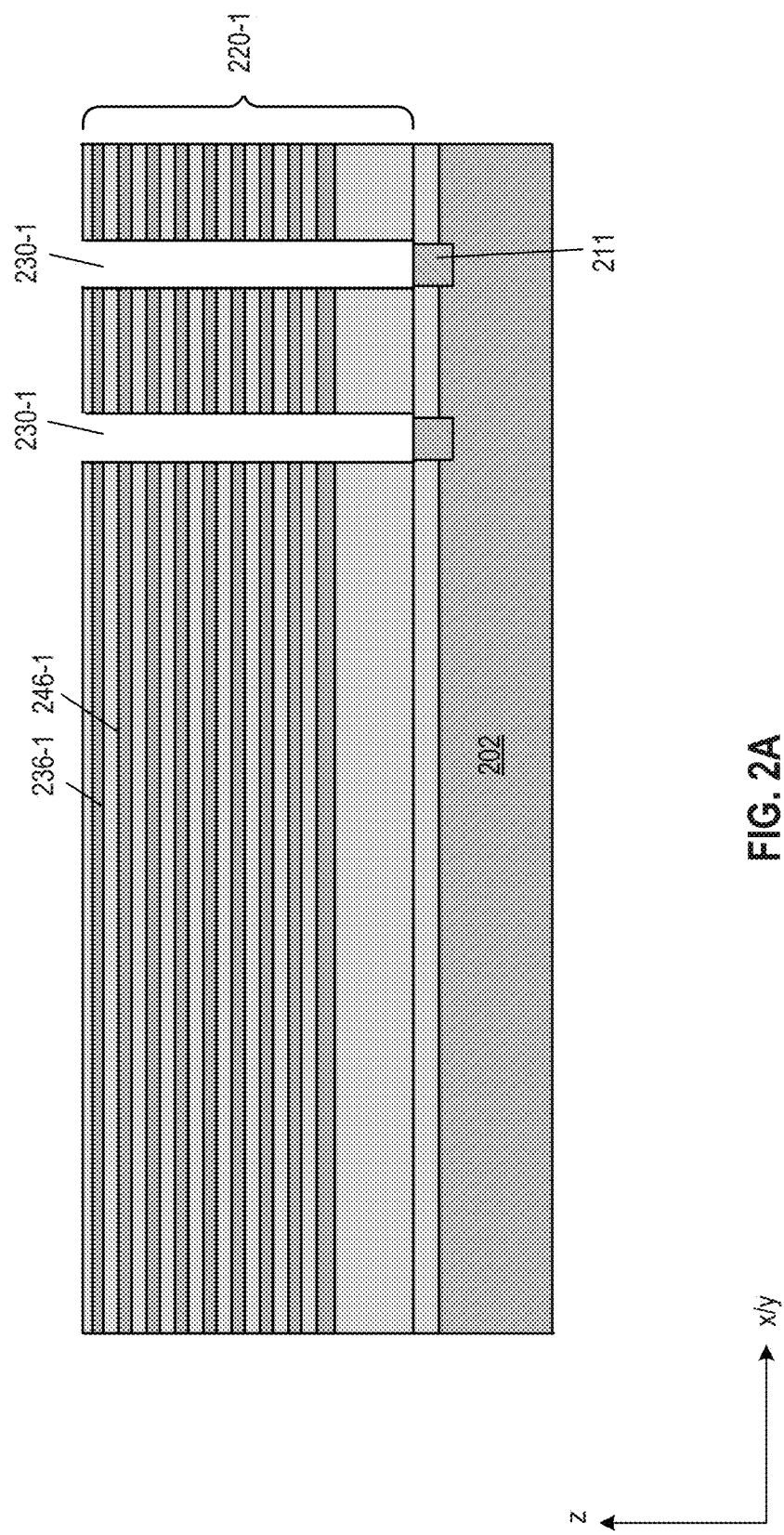
FIGS. 2A-2K illustrates cross-sectional views of a 3D memory device having multi-deck structure at various stages of an exemplary fabrication process, according to some embodiments of the present disclosure.
Figure 2B:
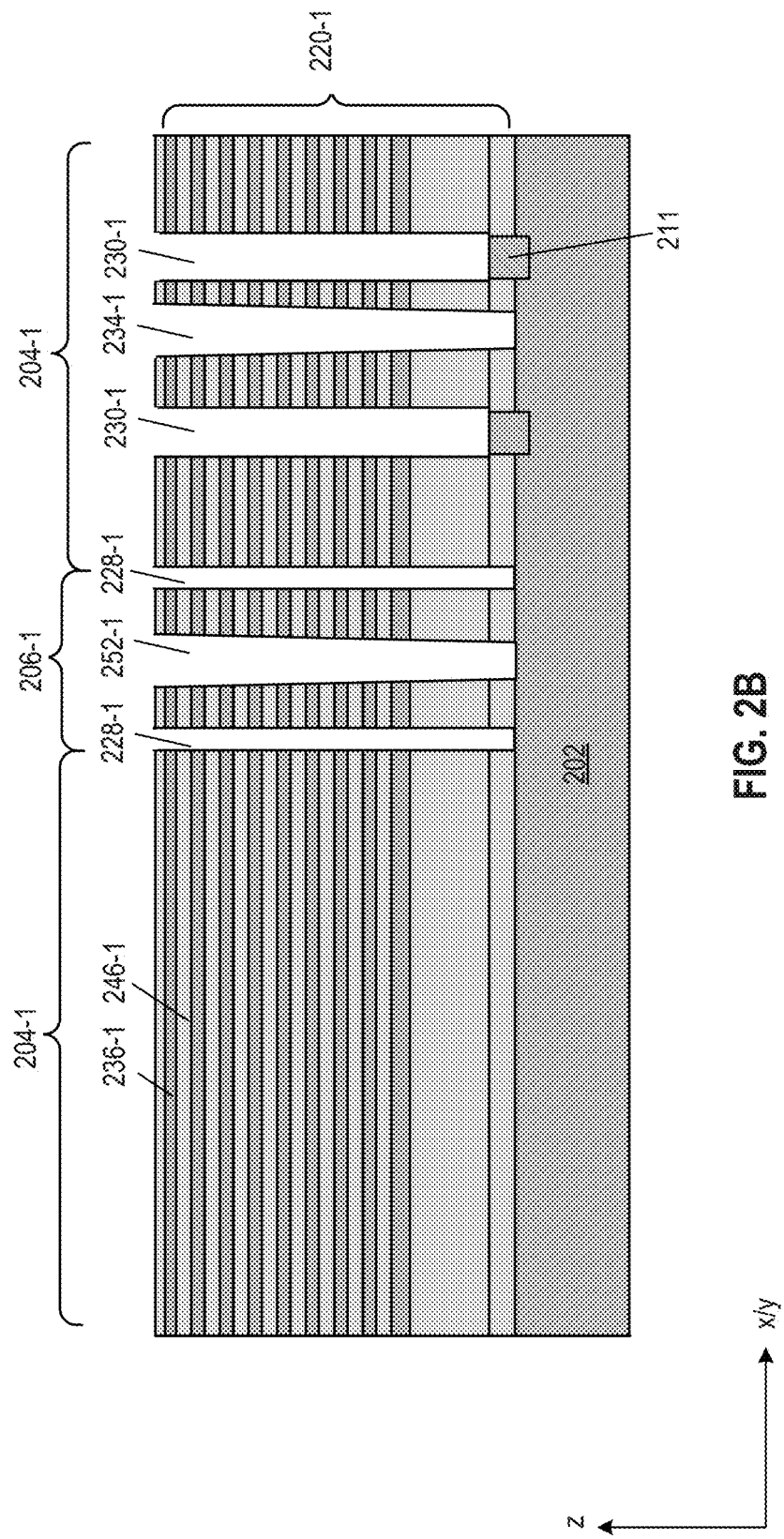
Figure 2C:
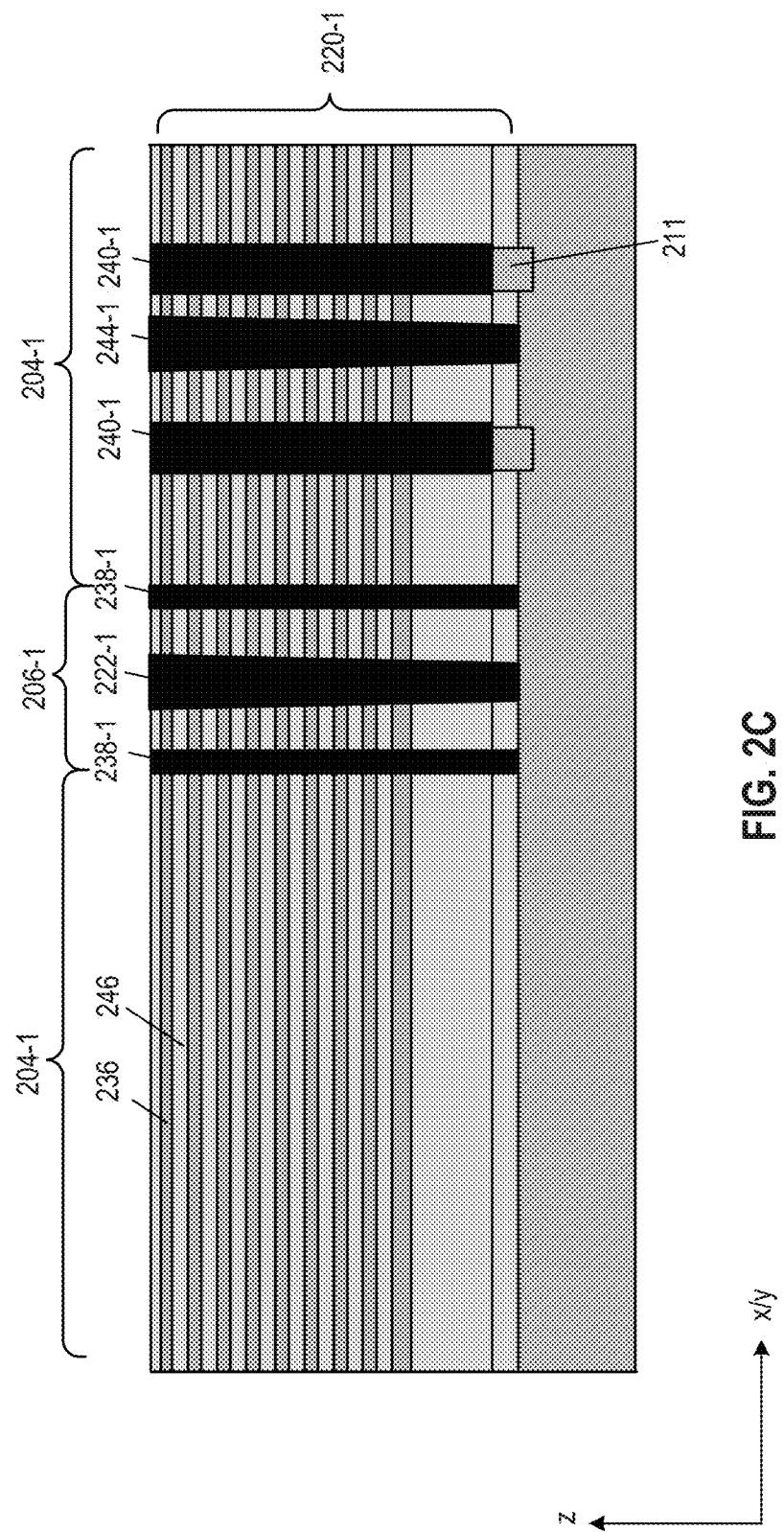
Figure 2D:
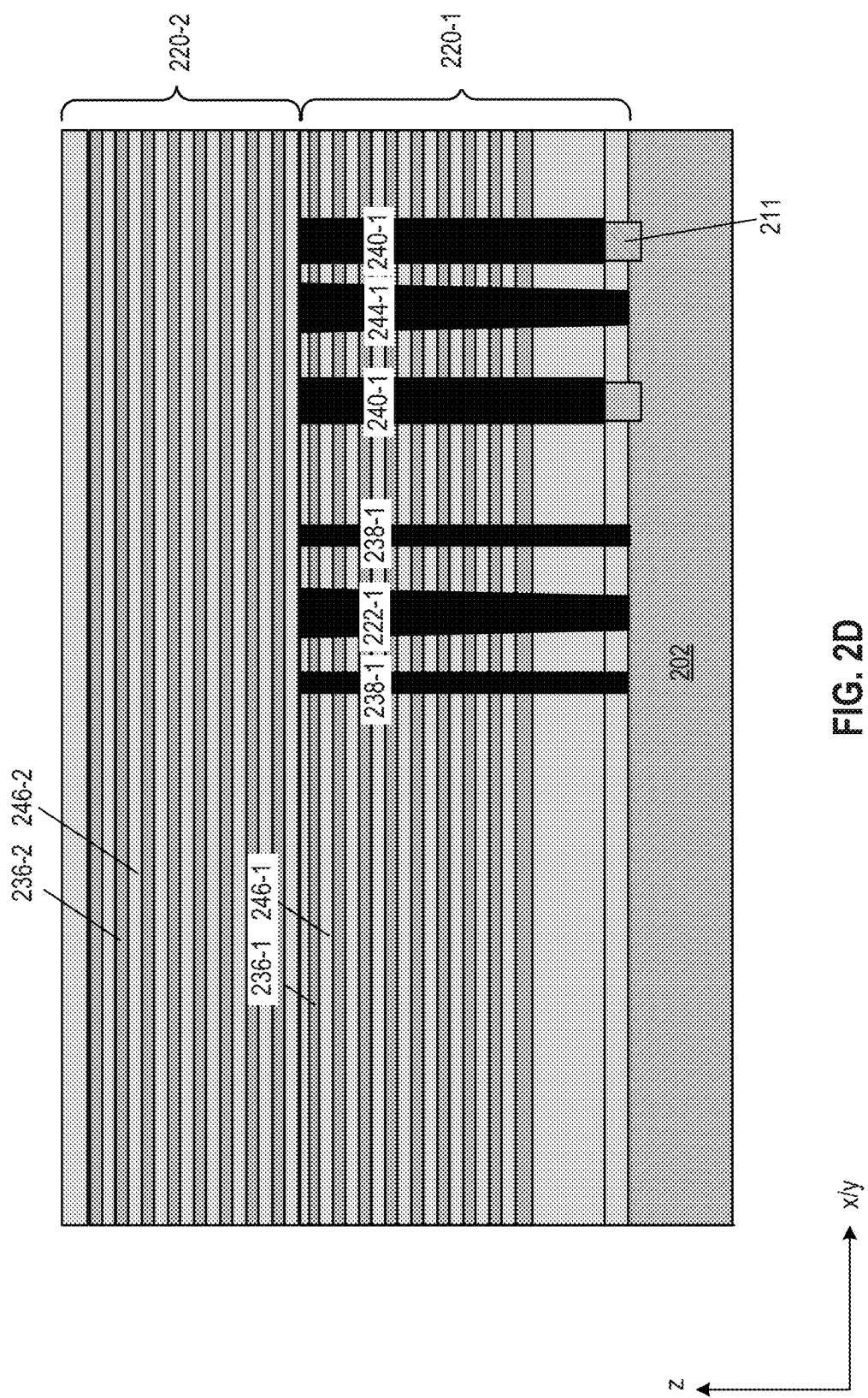
Figure 2E:
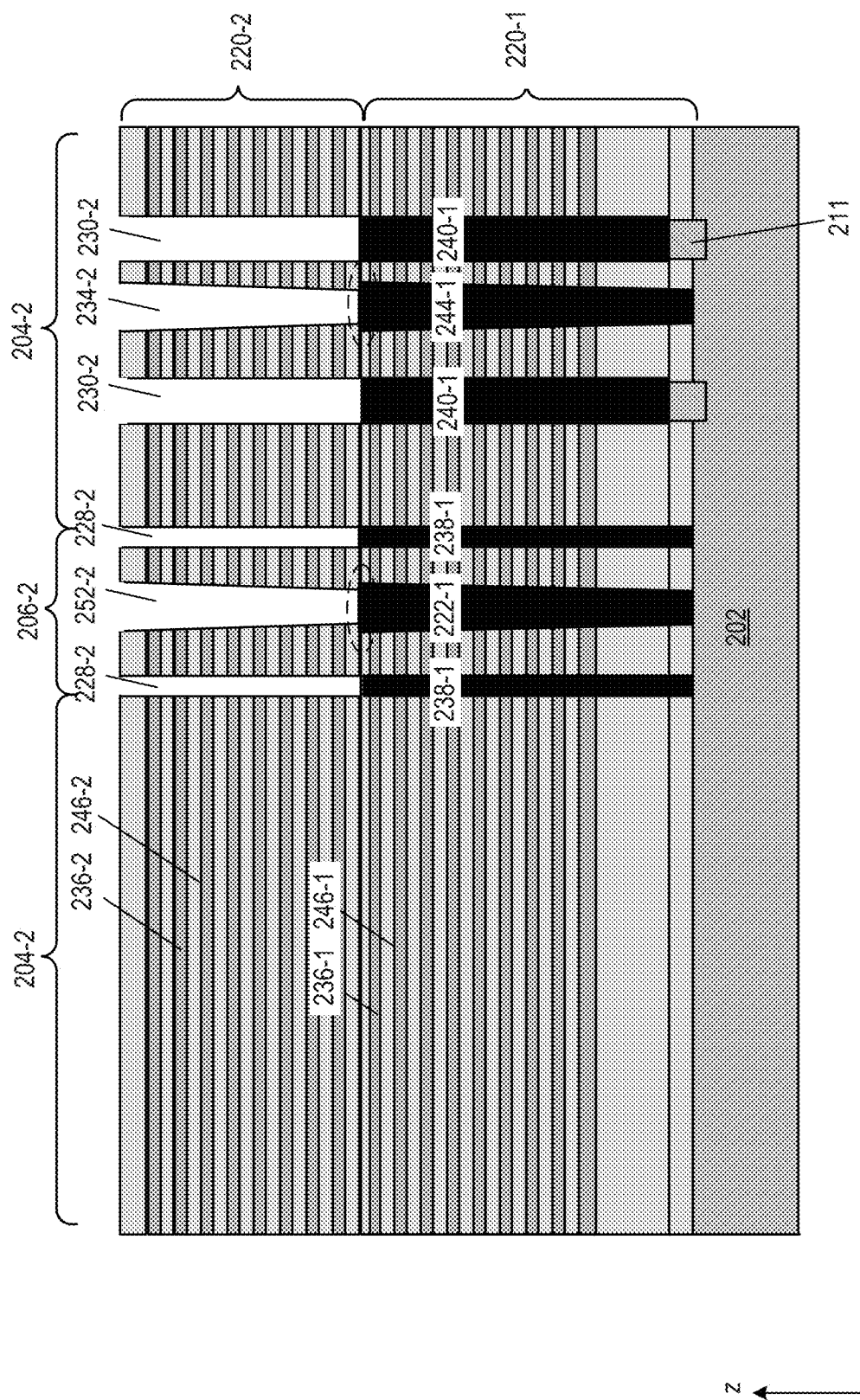
Figure 2F:
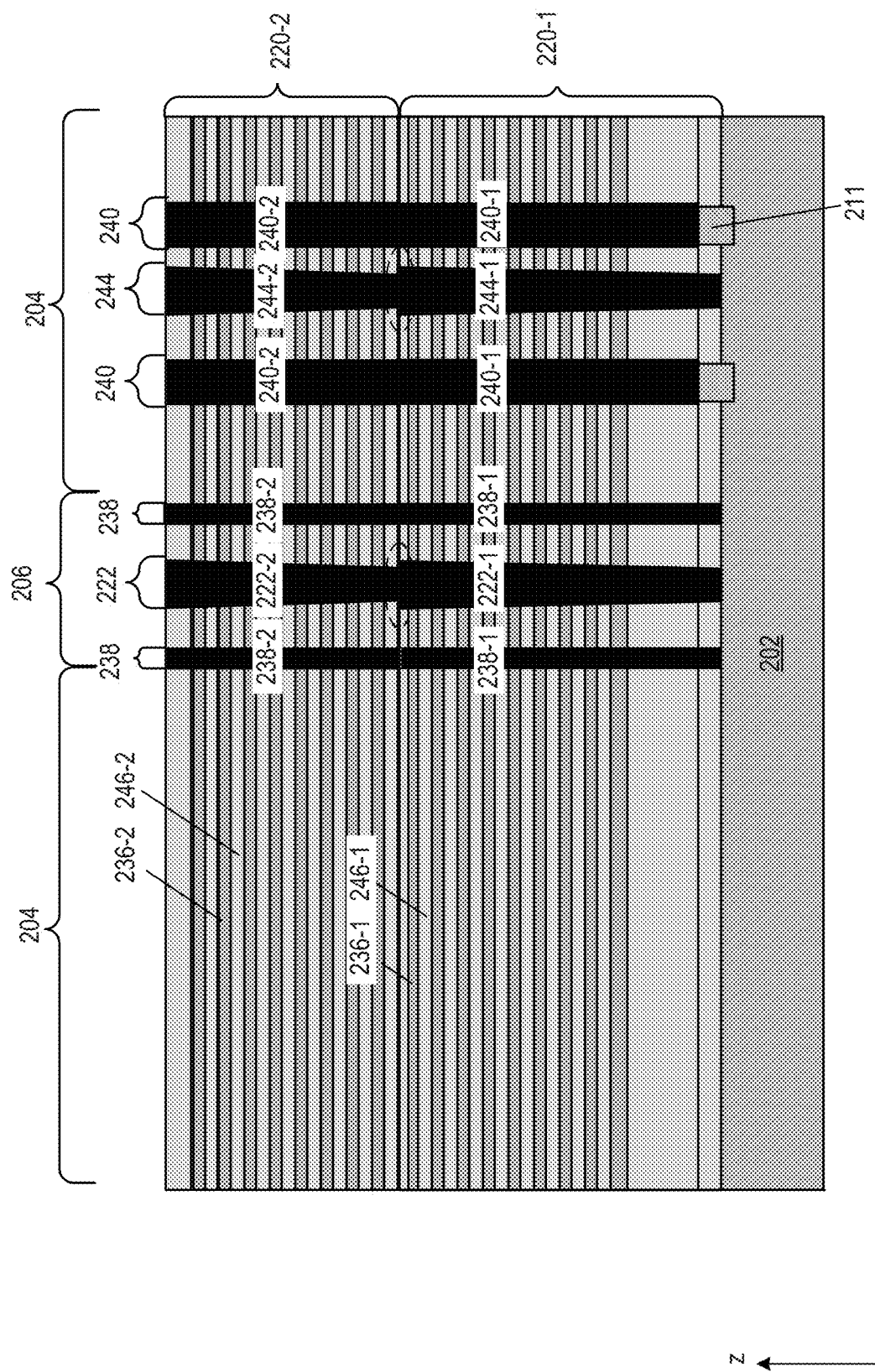
Figure 2G:
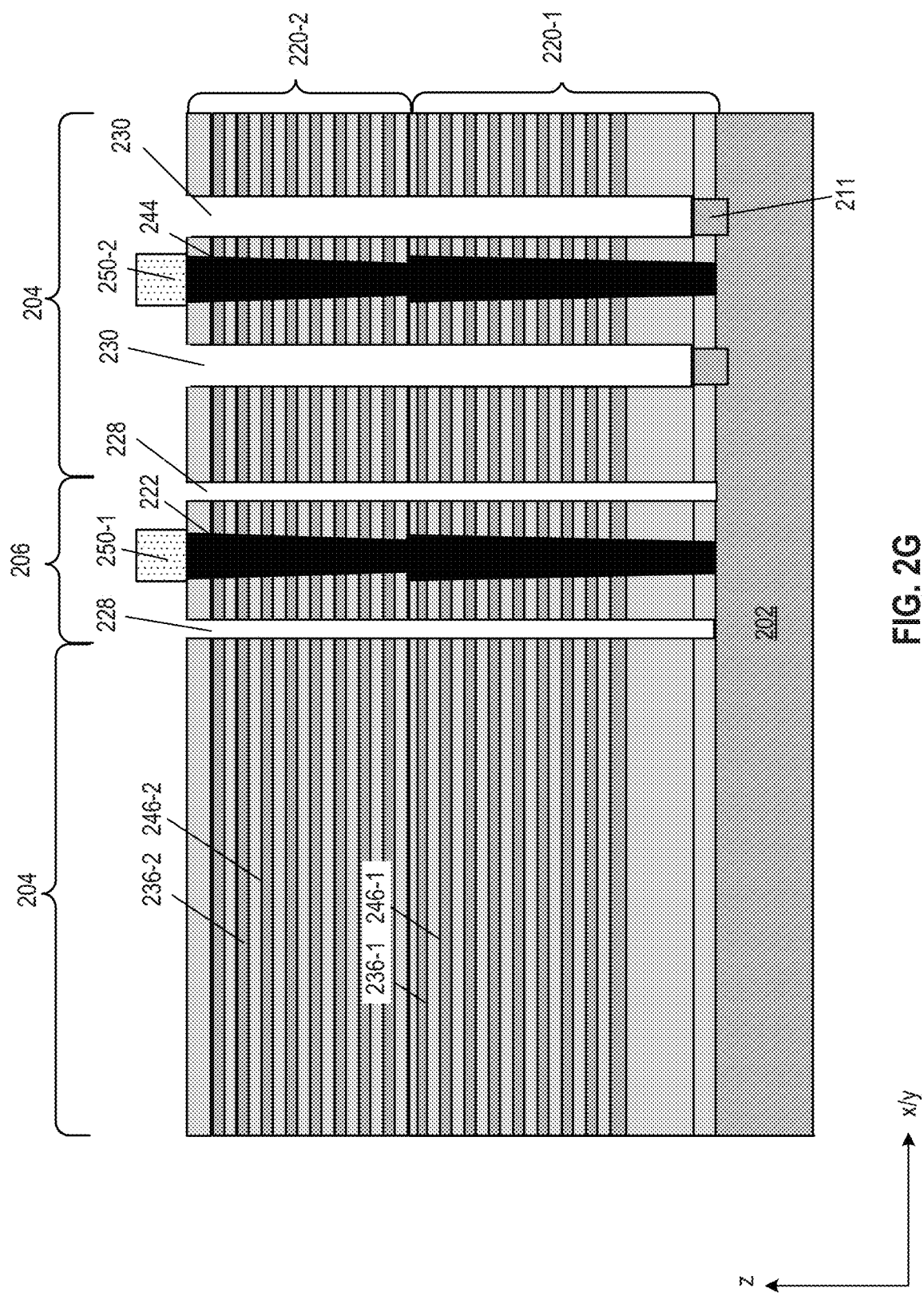
Figure 2H:
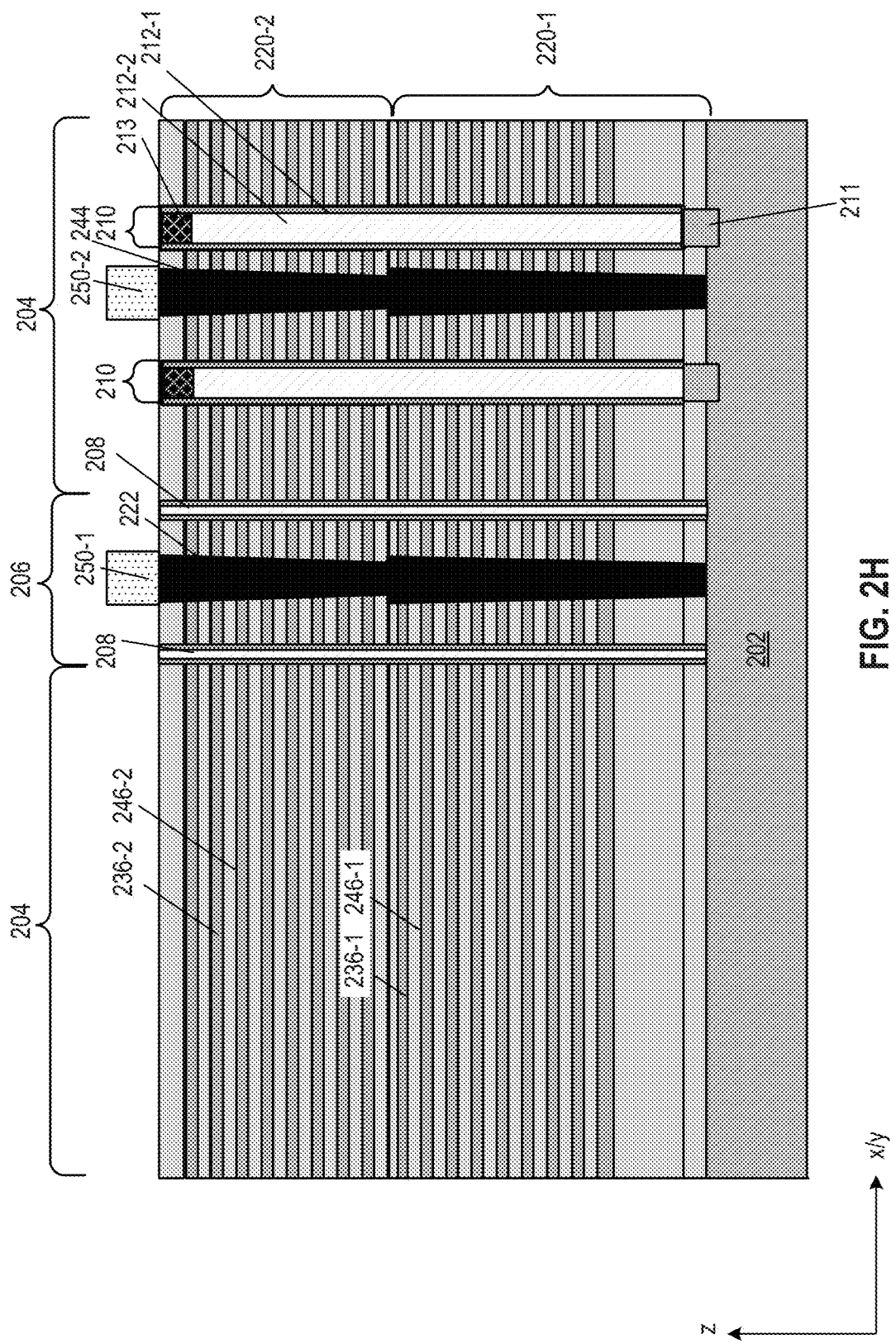
Figure 2I:
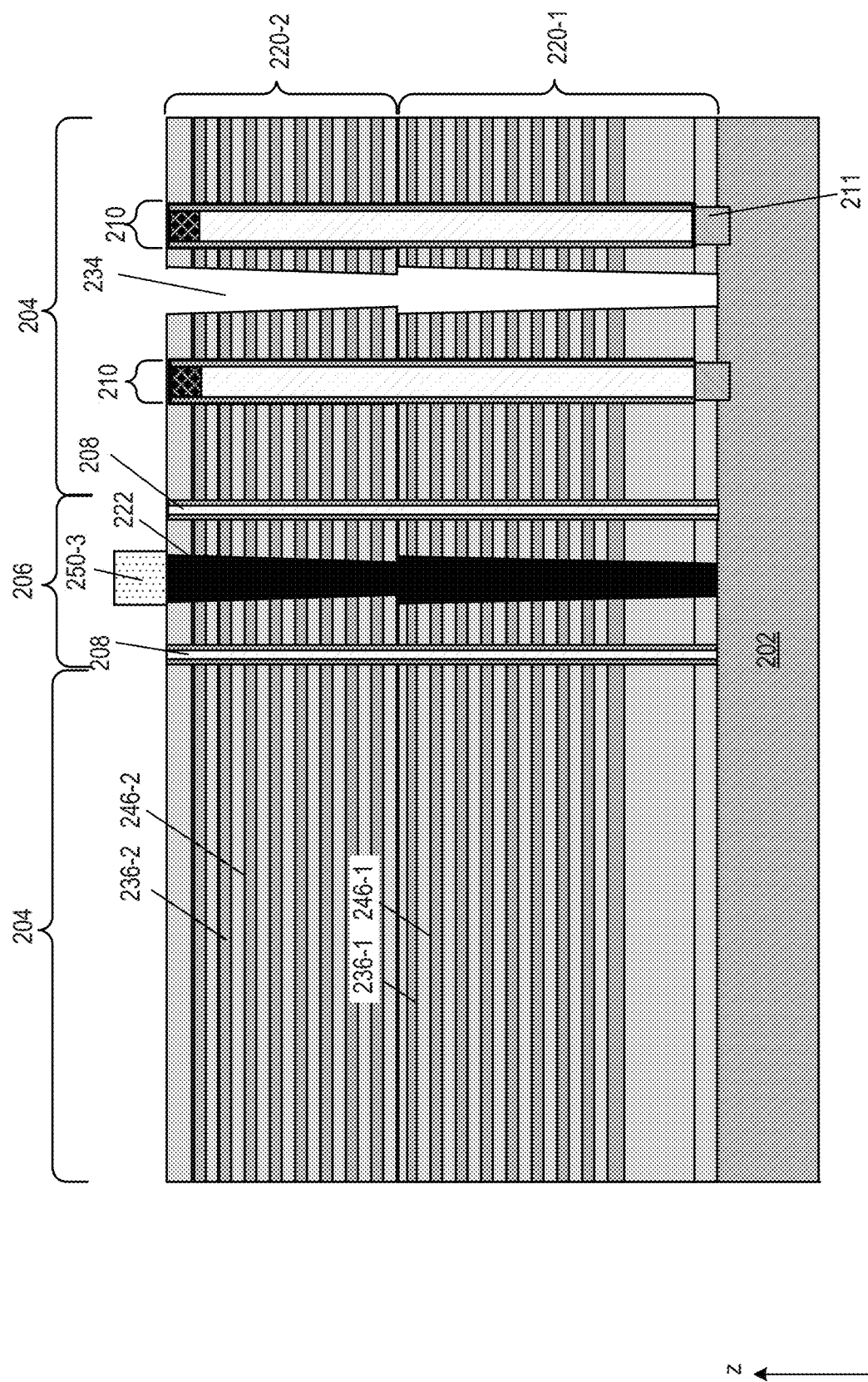
Figure 2J:
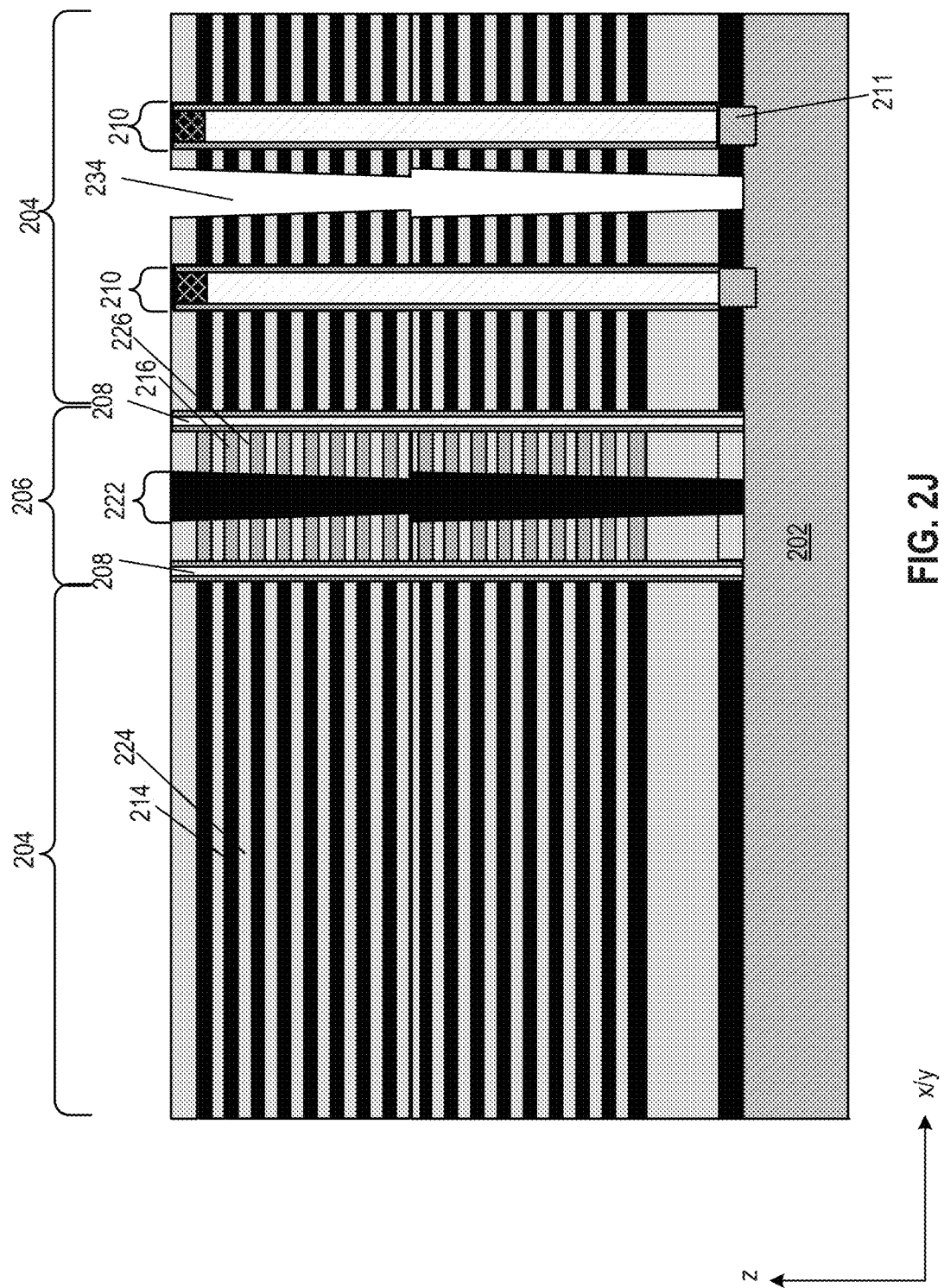
Figure 2K:
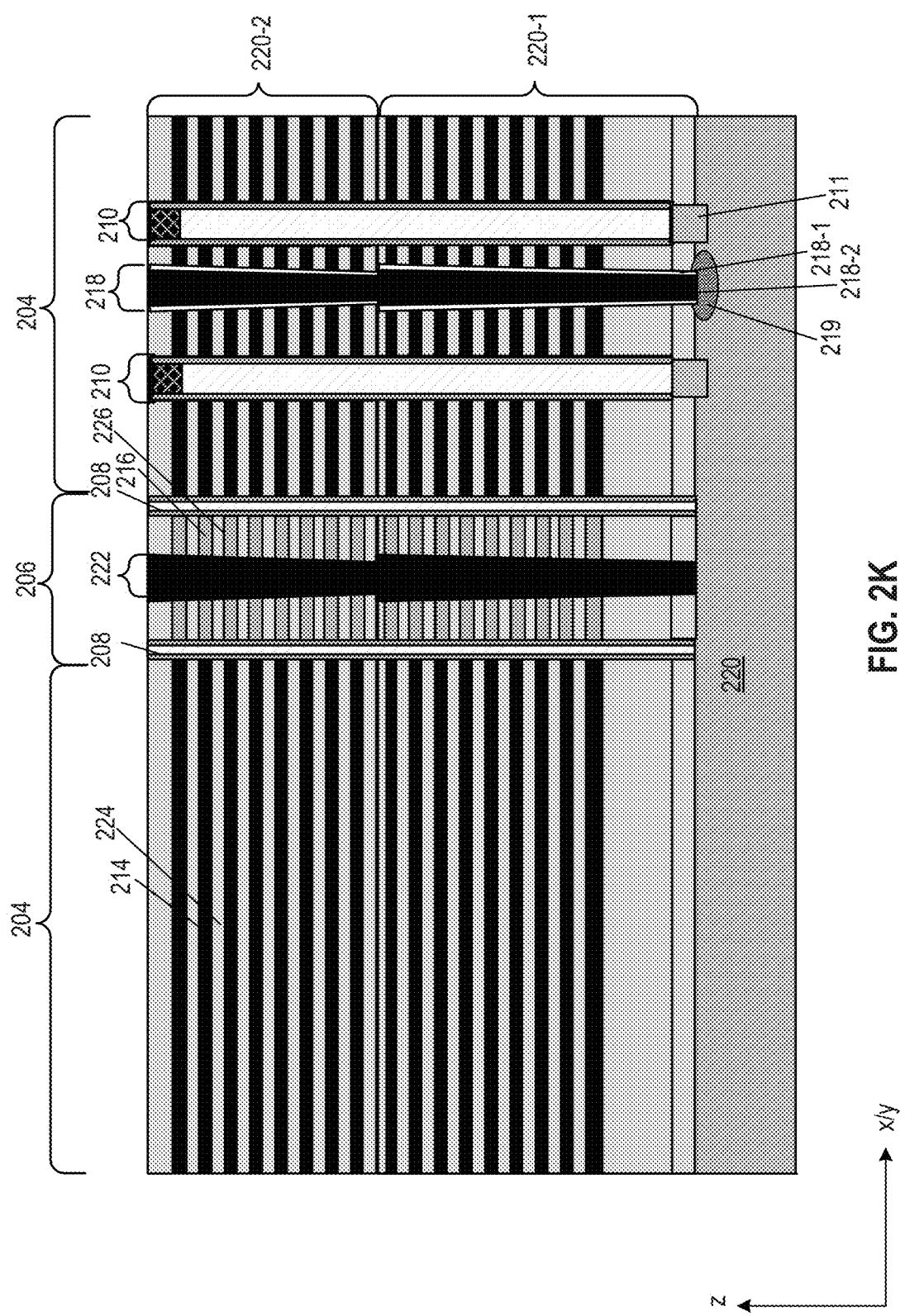
Figure 3A:
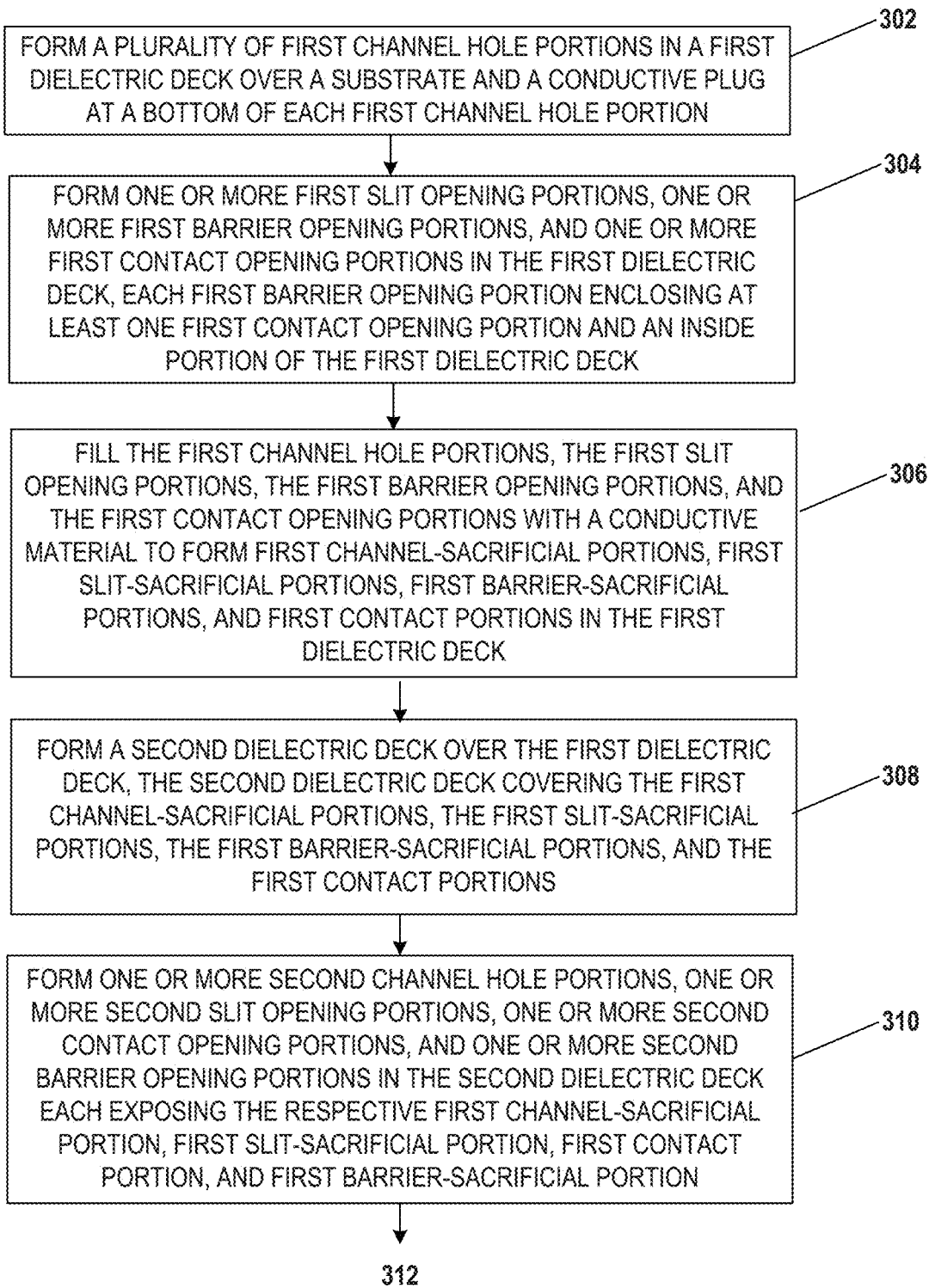
FIGS. 3A-3C illustrate a flowchart of an exemplary fabrication process for forming a 3D memory device having multi-deck structure, according to some embodiments of the present disclosure.
Figure 3B:
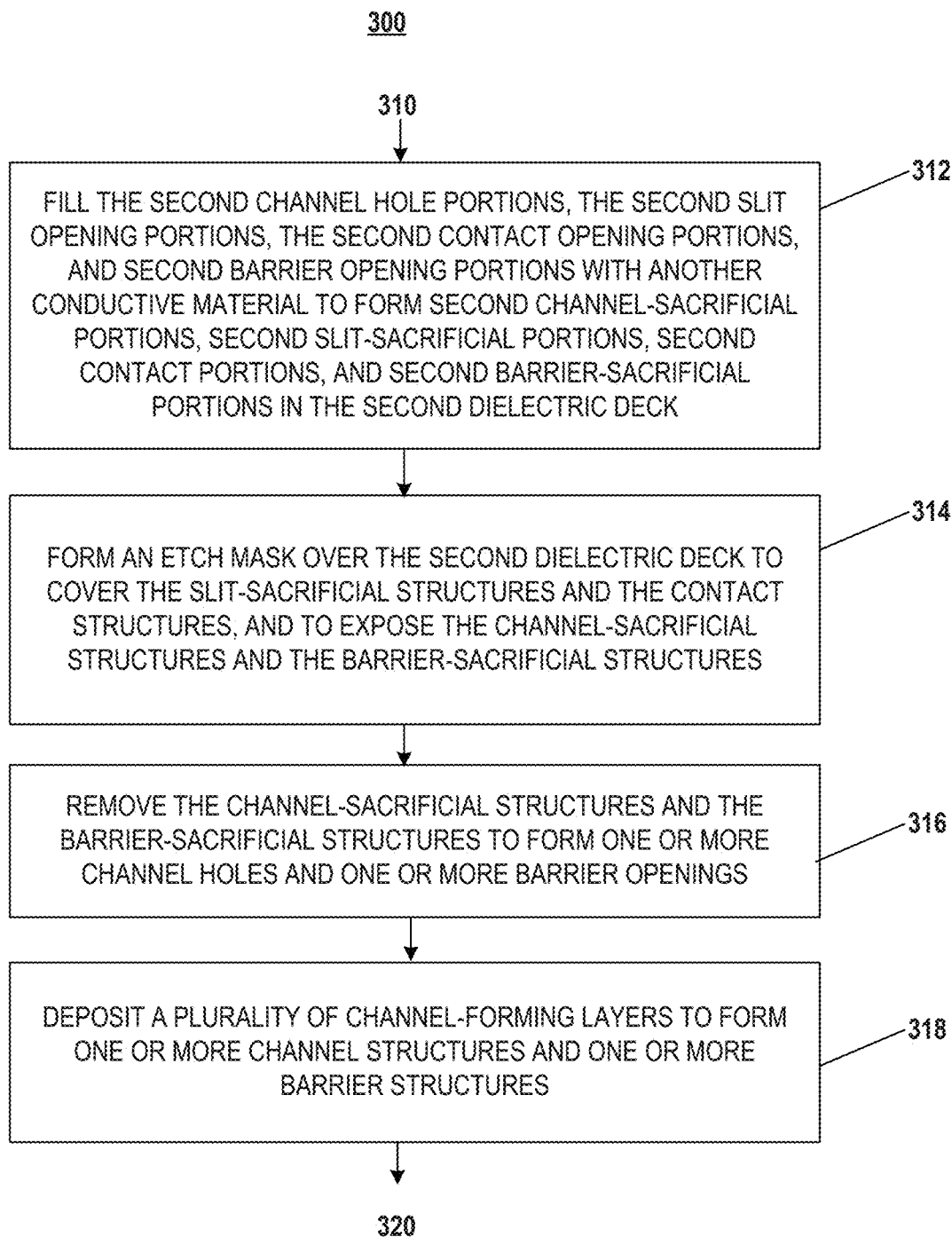
Figure 3C:
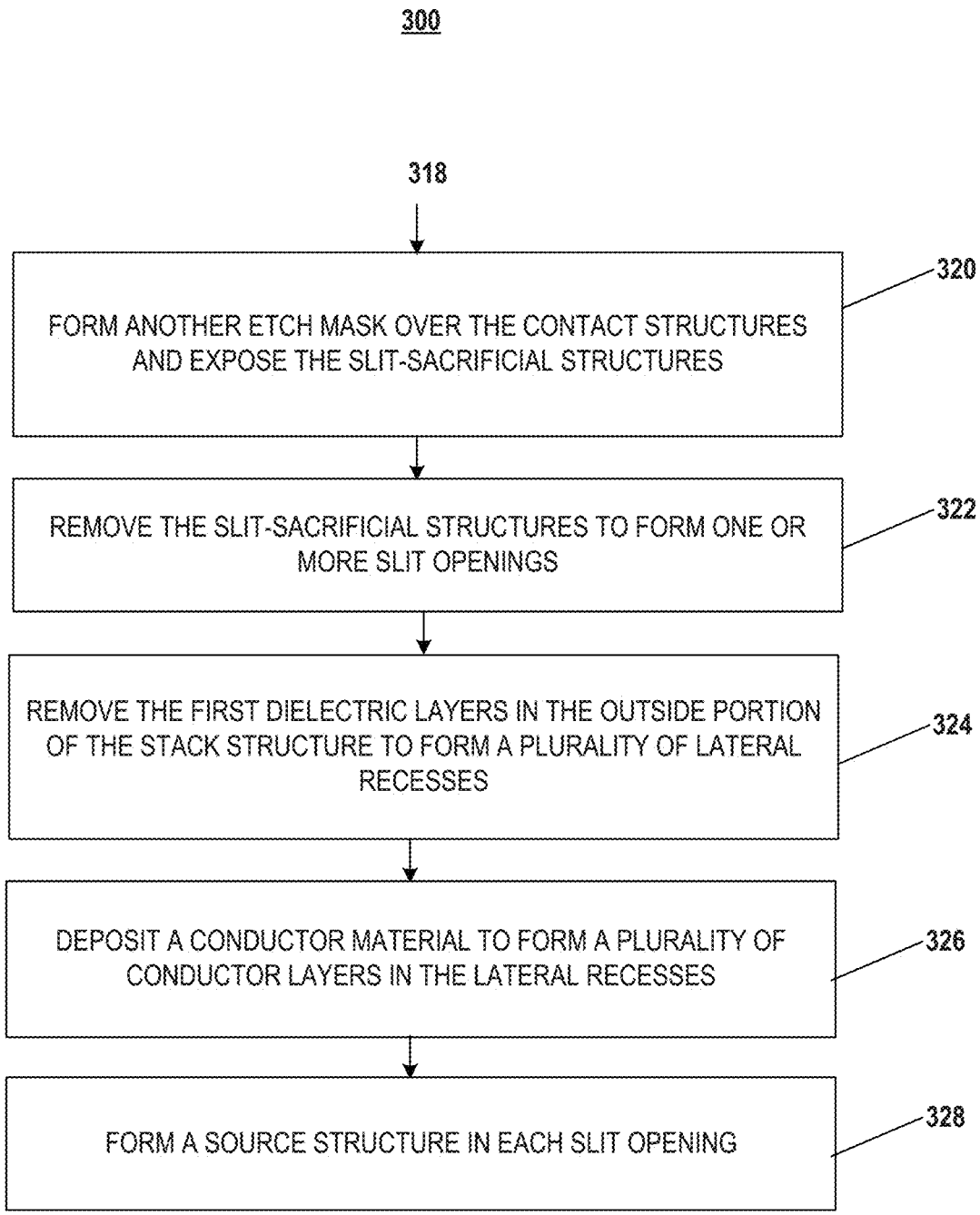

FIGS. 2A-2K illustrate cross-sectional views of 3D memory device 100 with a multi-deck structure at various stages of a fabrication process, according to some embodiments. FIGS. 3A-3C illustrate a flowchart of a fabrication process 300 to form 3D memory device 100. FIG. 3B is a continuation of FIG. 3A, and FIG. 3C is a continuation of FIG. 3B. For ease of illustration, the fabrication process of 3D memory device 100 having a double-deck structure is described. In various embodiments, a 3D memory device may also have more than two decks along the vertical direction (e.g., the z-direction). The fabrication of structures in a 3D memory device with more than two decks can be similar to the fabrication of 3D memory device 100 and is not described herein.

At the beginning of the process, a plurality of first channel hole portions are formed in a first dielectric deck over a substrate, and a conductive plug is formed at a bottom of each first channel hole portion (Operation 302). FIG. 2A illustrates a corresponding structure.

As shown in FIG. 2A, a plurality of first channel hole portion 230-1 may be formed in a first dielectric deck 220-1. First dielectric deck 220-1 may have a dielectric stack of interleaved first dielectric layers 236-1 and second dielectric layers 246-1 (e.g., dielectric layer pairs) over a substrate 202. A conductive plug 211 may be formed at the bottom of the respective first channel hole portion 230-1.

First dielectric deck 220-1 may be formed by alternatingly depositing first dielectric layers 236-1 and second dielectric layers 246-1 over substrate 202. First dielectric layers 236-1 and second dielectric layers 246-1 may have different etching selectivities during the subsequent gate-replacement process. In some embodiments, first dielectric layers 236-1 and second dielectric layers 246-1 include different materials. In some embodiments, first dielectric layers 236-1 include silicon nitride, and the deposition of first dielectric layers 236-1 includes one or more of chemical vapor deposition (CVD), physical vapor deposition (PVD), and atomic layered deposition (ALD). In some embodiments, second dielectric layers 246-1 include silicon oxide, and the deposition of second dielectric layers 246-1 includes one or more of CVD, ALD, and PVD.

A plurality of first channel hole portions 230-1 may be formed extending vertically through first dielectric deck 220-1. The plurality of first channel hole portions 230-1 may be formed by performing an anisotropic etching process (e.g., dry etch) and/or an isotropic etching process (wet etch), using an etch mask such as a patterned PR layer, to remove portions of first dielectric deck 220-1. In some embodiments, the etching of first dielectric layers 236-1 and second dielectric layers 246-1 include a suitable anisotropic etching process such as dry etch, and/or a suitable isotropic etching process such as wet etch.

A recess region may be formed at the bottom of each first channel hole portion 230-1 to expose a top portion of substrate 202 by the same etching process that forms the respective first channel hole portion 230-1 above substrate 202 and/or by a separate recess etching process. In some embodiments, conductive plug 211 is formed at the bottom of each first channel hole portion 230-1, e.g., over the recess region. Conductive plug 211 may be formed by an epitaxial growth process and/or a deposition process and may include a semiconductor material. In some embodiments, conductive plug 211 is formed by epitaxial growth and is referred to as an epitaxial portion. Optionally, a recess etch (e.g., dry etch and/or wet etch) may be performed to remove excess semiconductor material on the sidewall of the channel hole and/or control the top surface of conductive plug 2111 at a desired position. In some embodiments, conductive plug 211 includes single crystalline silicon and is formed by epitaxially grown from substrate 102. In some embodiments, conductive plug 211 includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD.

Referring back to FIG. 3A, after the formation of the first channel hole portions and the conductive plugs, one or more first slit opening portions, one or more first barrier opening portions, and one or more first contact opening portions are formed in the first dielectric deck (Operation 304). Each first barrier opening portion encloses at least one first contact opening portion and an inside portion of the first dielectric deck. FIG. 2B illustrates a corresponding structure.

As shown in FIG. 2B, in a same process, one or more first slit opening portions 234-1, one or more first barrier opening portions 228-1, and one or more first contact opening portions 252-1 may be formed vertically through first dielectric deck 220-1. Each first barrier opening portion 228-1 may laterally enclose at least one first contact opening portion 252-1 and a portion of first dielectric deck 220-1. The portion of first dielectric deck 220-1 enclosed by first barrier opening portion 228-1 may be referred to as an inside portion 206-1 of first dielectric deck 220-1. The portion of first dielectric deck 220-1 not enclosed by first barrier opening portions 228-1, e.g., outside of inside portion 206-1, may be referred to as an outside portion 204-1 of first dielectric deck 220-1. In some embodiments, first slit opening portions 234-1 and first channel hole portions 230-1 may be formed in outside portion 204-1, and first barrier opening portions 228-1 and first contact opening portions 252-1 may be formed in inside portion 206-1. First barrier opening portion 228-1 may separate inside portion 206-1 and outside portion 204-1 of first dielectric deck 220-1.

In some embodiments, a suitable anisotropic etching process (e.g., dry etch) and a suitable isotropic etching process (e.g., wet etch), can be performed to form first slit opening portions 234-1, first barrier opening portions 228-1, and first contact opening portions 252-1. Substrate 202 may be exposed at the bottom of each first slit opening portion 234-1, each first barrier opening portion 228-1, and each first contact opening portion 252-1. In some embodiments, the cross-sections of first slit opening portion 234-1 and first contact opening portion 252-1 each includes a trapezoid shape, with a lateral dimension gradually decreases towards substrate 202. In some embodiments, a lateral dimension of first barrier opening portion 228-1 is less than a lateral dimension of first channel hole portion 230-1.

Referring back to FIG. 3A, after the formation of the first slit opening portions, the first barrier opening portions, and the first contact opening portions, a conductive material is deposited to fill in the first channel hole portions, the first slit opening portions, the first barrier opening portions, and the first contact opening portions to form first channel-sacrificial portions, first slit-sacrificial portions, first barrier-sacrificial portions, and first contact portions in the first dielectric deck (Operation 306). FIG. 2C illustrates a corresponding structure.

As shown in FIG. 2C, in a same process, a conductive material can be deposited to fill in first channel hole portions 230-1, first slit opening portions 234-1, first barrier opening portions 228-1, and first contact opening portions 252-1 to respective form first channel-sacrificial portions 240-1, first slit-sacrificial portions 244-1, first barrier-sacrificial portions 238-1, and first contact portions 222-1. The conductive material may include one or more of tungsten, polysilicon, doped silicon, silicides, cobalt, aluminum, and copper, and can be deposited using a suitable deposition process such as one or more of CVD, PVD, ALD, and electroplating. Optionally, a planarization process, e.g., dry/wet etch and/or CMP, is performed to remove any excess material (e.g., the deposited conductive material) on the top surface of first dielectric deck 220-1.

Referring back to FIG. 3A, after the formation of the first channel-sacrificial portions, the first slit-sacrificial portions, the first barrier-sacrificial portions, and the first contact portions, a second dielectric deck is formed over the first dielectric deck (Operation 308). The second dielectric deck covers the first channel-sacrificial portions, the first slit-sacrificial portions, the first barrier-sacrificial portions, and the first contact portions. FIG. 2D illustrates a corresponding structure.

As shown in FIG. 2D, a second dielectric deck 220-2 may be formed over first dielectric deck 220-1 and cover first channel-sacrificial portions 240-1, first slit-sacrificial portions 244-1, first barrier-sacrificial portions 238-1, and first contact portions 222-1. Second dielectric deck 220-2 may include a plurality of interleaved first dielectric layer 236-2 and second dielectric layers 246-2 (e.g., a plurality of dielectric pairs). In some embodiments, first dielectric layers 236-2 may be similar to or the same as first dielectric layers 236-1, and second dielectric layers 246-2 may be similar to or the same as second dielectric layers 246-1. The formation of second dielectric deck 220-2 may be similar to or the same as the formation of first dielectric deck 220-1 and the detailed description is not repeated herein. First dielectric deck 220-1 and second dielectric deck 220-2 may form a stack structure 220. In some embodiments, a dielectric cap layer, e.g., including a suitable dielectric material such as silicon oxide, is formed over second dielectric deck 220-2.

Referring back to FIG. 3A, in a same process, one or more second channel hole portions, one or more second slit opening portions, one or more second contact opening portions, and one or more second barrier opening portions are formed to each expose the respective first channel-sacrificial portion, first slit-sacrificial portion, first contact portion, and first barrier-sacrificial portion (Operation 310). FIG. 2E illustrates a corresponding structure.

As shown in FIG. 2E, one or more second channel hole portions 230-2, one or more second slit opening portions 234-2, one or more second contact opening portions 252-2, and one or more second barrier opening portions 228-2 are formed to extend vertically (e.g., along the z-direction) through second dielectric deck 220-2 and expose the respective first channel-sacrificial portions 240-1, first slit-sacrificial portions 244-1, first contact portions 222-1, and first barrier-sacrificial portions 238-1. Each of second channel hole portion 230-2, second slit opening portion 234-2, second contact opening portion 252-2, and second barrier opening portion 228-2 may be aligned vertically (e.g., along the z-direction) with the respective first channel-sacrificial portion 240-1, first slit-sacrificial portion 244-1, first contact portion 222-1, and first barrier-sacrificial portion 238-1. Second channel hole portions 230-2 and second slit opening portions 234-2 may be formed in an outside portion 204-2 of second dielectric deck 220-2, and second contact opening portions 252-2 and second barrier opening portions 228-2 may be formed in an inside portion 206-2 of second dielectric deck 220-2.

In some embodiments, the cross-sections of second slit opening portion 234-2 and second contact opening portion 252-2 each includes a trapezoid shape, with a lateral dimension gradually decreases towards substrate 202. In some embodiments, a lateral dimension of second barrier opening portion 228-2 is less than a lateral dimension of second channel hole portion 230-2. In some embodiments, at the interface of first dielectric deck 220-1 and second dielectric deck 220-2, a lateral dimension (e.g., diameter) of second slit opening portion 234-2 is less than a lateral dimension (e.g., diameter) of first slit-sacrificial portion 244-1, and a lateral dimension (e.g., diameter) of second contact opening portion 252-2 is less than a lateral dimension (e.g., diameter) of first contact portion 222-1. Accordingly, at the interface, a lateral portion of first contact portion 222-1 may surround second contact opening portion 252-2, and a lateral portion of first slit-sacrificial portion 244-1 may surround second slit opening portion 234-2. In some embodiments, the cross-sections of second barrier opening portion 228-2, first barrier opening portion 228-1, second channel hole portion 230-2, and first channel hole portion 230-1 also have a trapezoid shape, with a lateral dimension gradually decreases towards substrate 202. A staggered portion may be formed between second barrier opening portion 228-2 and first barrier opening portion 228-1 and between second channel hole portion 230-2 and first channel hole portion 230-1 at the interface of first dielectric deck 220-1 and second dielectric deck 220-2. A suitable anisotropic etching process (e.g., dry etch) and/or a suitable isotropic etching process (e.g., wet etch) may be employed to remove portions of second dielectric deck 220-2 and form second channel hole portions 230-2, second slit opening portions 234-2, second contact opening portions 252-2, and second barrier opening portions 228-2.

Referring back to FIG. 3B, after the formation of the second channel hole portions, the second slit opening portions, the second contact opening portions, and the second barrier opening portions, another conductive material is deposited to fill in the second channel hole portions, the second slit opening portions, the second contact opening portions, and the second barrier opening portions to form second channel-sacrificial portions, second slit-sacrificial portions, second contact portions, and second barrier-sacrificial portions in the second dielectric deck (Operation 312). FIG. 2F illustrates a corresponding structure.

As shown in FIG. 2F, in a same process, another conductive material may be deposited to fill in second channel hole portions 230-2, second slit opening portions 234-2, second contact opening portions 252-2, and second barrier opening portions 228-2 to form second channel-sacrificial portions 240-2, second slit-sacrificial portions 244-2, second contact portions 222-2, and second barrier-sacrificial portions 238-2 in second dielectric deck 220-2. In some embodiments, each of second channel-sacrificial portion 240-2, second slit-sacrificial portion 244-2, second contact portion 222-2, and second barrier-sacrificial portion 238-2 is in contact with respective first channel-sacrificial portion 240-1, first slit-sacrificial portion 244-1, first contact portion 222-1, and first barrier-sacrificial portion 238-1. Each first barrier-sacrificial portion 238-1 and the respective second barrier-sacrificial portion 238-2 may form a barrier-sacrificial structure 238. Each first slit-sacrificial portion 244-1 and the respective second slit-sacrificial portion 244-2 may form a slit-sacrificial structure 244. Each first channel-sacrificial portion 240-1 and the respective second channel-sacrificial portion 240-2 may form a channel-sacrificial structure 240. Each first contact portion 222-1 and the respective second contact portion 222-2 may form a contact structure 222. In some embodiments, the difference between lateral dimensions of first contact portions 222-1 and second contact portion 222-2 may form a staggered portion/shape at the interface. In some embodiments, the difference between lateral dimensions of first slit-sacrificial portion 244-1 and second slit-sacrificial portion 244-2 may form a staggered portion/shape at the interface. First dielectric deck 220-1 and second dielectric deck 220-2 may be referred to as a stack structure 220. Channel-sacrificial structures 240 and slit-sacrificial structures 244 may be formed in an outside portion 204 of stack structure 220, and contact structures 222 and barrier-sacrificial structures 238 may be formed in an inside portion 206 of stack structure 220.

The other conductive material may be the same as or different from the conductive material that fills first channel hole portions 230-1, first slit opening portions 234-1, first contact opening portion 252-1, and first barrier opening portions 228-1. For example, the other conductive material may include one or more of tungsten, polysilicon, silicides, doped silicon, aluminum, copper, and cobalt. In some embodiments, the conductive material includes polysilicon and the other conductive material includes tungsten. In some embodiments, both the conductive material and the other conductive material include tungsten. The other conductive material may be deposited by a suitable deposition process such as CVD, PVD, ALD, and/or electroplating. Optionally, a planarization process (e.g., CMP and/or recess etch) is performed to remove excess materials, e.g., the other conductive material, on the top surface of second dielectric deck 220-2.

Referring back to FIG. 3B, after the formation of channel-sacrificial structures, slit-sacrificial structures, contact structures, and barrier-sacrificial structures, an etch mask is formed over the stack structure to cover the slit-sacrificial structures and the contact structures, and to expose the channel-sacrificial structures and the barrier-sacrificial structures (Operation 314). FIG. 2G illustrates a corresponding structure.

As shown in FIG. 2G, an etch mask 250, a patterned etch mask, can be formed over stack structure 220 (e.g., second dielectric deck 220-2) to cover slit-sacrificial structures 244 and contact structures 222, and to expose channel-sacrificial structures 240 and barrier-sacrificial structures 238. Specifically, etch mask 250 may have a portion 250-1 that covers contact structure 222 and another portion 250-2 that covers slit-sacrificial structure 244. Etch mask 250 may include any suitable material that can sustain the etching process. For example, etch mask 250 may include a soft material (e.g., photoresist), a hard material (e.g., carbon, polysilicon, and silicon carbide), or a combination thereof. Etch mask 250 may have a single-layered structure or a multi-layered structure. In some embodiments, etch mask 250 is a patterned photoresist layer.

Referring back to FIG. 3B, after the formation of the etch mask, the channel-sacrificial structures and the barrier-sacrificial structures are removed to form one or more channel holes and one or more barrier openings (Operation 316). FIG. 2G illustrates a corresponding structure.

Referring back to FIG. 2G, in a same process, channel-sacrificial structures 240 and barrier-sacrificial structures 238 are removed to form channel holes 230 and barrier openings 228. Barrier openings 228 may expose substrate 202 and channel holes 230 may expose conductive plug 211. A suitable anisotropic etching process (e.g., dry etch) and/or a suitable isotropic etching process (e.g., wet etch) can be performed to remove channel-sacrificial structures 240 and barrier-sacrificial structures 238, forming barrier openings 228 and channel holes 230. In some embodiments, channel hole 230 is formed by the joint connection of first channel hole portion 230-1 and second channel hole portion 230-2, and barrier opening 228 is formed by the joint connection of first barrier opening portion 228-1 and second barrier opening portion 228-2.

Referring back to FIG. 3B, after the formation of channel holes and barrier openings, a plurality of channel-forming layers to form one or more channel structures in the channel holes and one or more barrier structures in the barrier openings (Operation 318). FIG. 2H illustrates a corresponding structure.

As shown in FIG. 2H, in a same process, a plurality of channel-forming layers can be sequentially deposited in channel holes 230 to form a memory film and semiconductor layer 212-1 and a dielectric core 212-2. Specifically, the memory film may include a blocking layer, a memory layer, and a tunneling layer. In some embodiments, the dielectric core, semiconductor layer, the tunneling layer, the memory layer, and the blocking layer are arranged radially from the center toward the sidewall of channel structure 210 in this order. The dielectric core can include silicon oxide. The semiconductor layer can include silicon, such as amorphous silicon, polysilicon, and/or single crystalline silicon. The tunneling layer can include silicon oxide, silicon oxynitride, or any combination thereof. In one example, the memory layer can include a composite layer of silicon oxide/silicon oxynitride (or silicon nitride)/silicon oxide (ONO). The memory layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, a semiconductor channel is formed over and in contact with conductive plug 211 in channel hole 230. In some embodiments, the memory film is first deposited to cover the sidewall of the channel hole and the top surface of conductive plug 211, and a semiconductor layer is then deposited over the memory film and above conductive plug 211. The blocking layer, memory layer, and tunneling layer can be subsequently deposited in this order using one or more thin film deposition processes, such as ALD, CVD, PVD, any other suitable processes, or any combination thereof, to form the memory film. The semiconductor layer can then be deposited on the tunneling layer using one or more thin film deposition processes, such as ALD, CVD, PVD, any other suitable processes, or any combination thereof. In some embodiments, dielectric core 212-2 may fill in the remaining space of channel hole 230 by depositing dielectric materials after the deposition of the semiconductor layer, such as silicon oxide. Dielectric core 212-2 may be deposited by one or more of ALD, CVD, and PVD.

The lateral dimension of barrier opening 228 may be sufficiently small so that the deposition of the blocking layer, the memory layer, and/or the tunneling layer, can fill in barrier opening 228 with dielectric materials. Barrier structures 208 can then be formed, separating inside portion 206 and outside portion 204 of stack structure 220. In some embodiments, barrier structures 208 includes one or more of silicon oxide, silicon oxynitride, high-k dielectrics, and/or silicon nitride, and provides insulation between outside portion 204 and inside portion 206 in 3D memory device 100.

In some embodiments, a drain structure 213 is formed in the upper portion of each channel hole 230. In some embodiments, parts of memory film, semiconductor layer, and dielectric core 212-2 on the top surface of stack structure 220 and in the upper portion of each channel hole 230 can be removed by CMP, grinding, wet etching, and/or dry etching to form a recess in the upper portion of channel hole 230 so that a top surface of semiconductor channel may be located at a desired position in channel hole 230. In some embodiments, etch mask 250 may be removed and an additional mask layer may be formed to expose channel holes 230 for the formation of drain structures 213. In some embodiments, etch mask 250 is not removed and no additional etch mask is needed for the formation of drain structures 213. Drain structure 213 then can be formed by depositing conductive materials, such as metals and/or silicon, into the recess by one or more thin film deposition processes, such as CVD, PVD, ALD, electroplating, electroless plating, or any combination thereof. A channel structure 210 is thereby formed. Optionally, a planarization process, e.g., dry/wet etch and/or CMP, is performed to remove any excess material on the top surface of stack structure 220.

Referring back to FIG. 3C, after the formation of channel structures and barrier structures, another etch mask is formed over the contact structure and the slit-sacrificial structures are exposed (Operation 320). FIG. 2I illustrates a corresponding structure.

As shown in FIG. 2I, another etch mask 250-3 may be formed to cover each contact structure 222 and slit-sacrificial structures 244 may be exposed. In some embodiments, channel structures 210 are exposed. Etch mask 250-3 may be portion 250-1 of etch mask 250, retained from Operation 318, or may be formed by a separate process, depending on the process that forms drain structure 213. Similar to etch mask 250, etch mask 250-3 may include a soft material and/or a hard material, and may have a single-layered structure or a multi-layered structure. The detailed descriptions of etch mask 250-3 may be referred to the descriptions of etch mask 250 and is not repeated herein.

Referring back to FIG. 3C, after the formation of the other etch mask, the slit-sacrificial structures are removed to form one or more slit openings (Operation 322). FIG. 2I illustrates a corresponding structure.

As shown in FIG. 2I, slit-sacrificial structures 244 may be removed to form slit openings 234, exposing substrate 202. A suitable anisotropic etching process (e.g., dry etch) and/or a suitable isotropic etching process (e.g., wet etch) can be performed to remove slit-sacrificial structures 244, forming slit openings 234, which is formed by the joint connection of adjacent slit opening portions (e.g., first slit opening portion 234-1 and second slit opening portion 234-2). In some embodiments, drain structures 213 may function as etch stop layers to prevent channel structures 210 from being etched.

Referring back to FIG. 3C, after the formation of the slit openings, portions of the first dielectric layers in the outside portion of the stack structure are removed through the slit opening to form a plurality of lateral recesses in the outside portion of the stack structure (Operation 324), and a conductor material is deposited to form a plurality of conductor layers in the lateral recesses in the outside portion of the stack structure (Operation 326). FIG. 2J illustrates a corresponding structure.

As shown in FIG. 2J, first dielectric layers 236-1 and 236-2 in outside portion 204 of stack structure 220 may be removed to form a plurality of lateral recesses in outside portion 204. Barrier structures 208 may retain portions of first dielectric layers 236-1 and 236-2 in inside portion 206. The etching of first dielectric layers 236-1 and 236-2 may include an isotropic etching process, e.g., wet etch. A conductor material may then be deposited to fill in the lateral recesses, forming a plurality of conductor layers 214 in outside portion 204. The remaining portions of second dielectric layers (e.g., 246-1 and 246-2) in outside portion 204 may be depicted as dielectric layers 224. Conductor layers 214 and dielectric layers 224 in outside portion 204 of stack structure 220 may form an alternating conductor/dielectric stack in outside portion 204. The remaining portions of first dielectric layers (e.g., 236-1 and 236-2) in inside portion 206 may be depicted as first dielectric layers 216. The remaining portions of second dielectric layers (e.g., 246-1 and 246-2) in outside portion 204 may be depicted as second dielectric layers 226. First dielectric layers 216 and second dielectric layers 226 may form an alternating dielectric stack in inside portion 206 of stack structure 220. Accordingly, stack structure 220, with the alternating dielectric stack and the alternating conductor/dielectric stack, may be referred to as an alternating layer stack. First dielectric deck 220-1 may form a first memory deck, and second dielectric deck 220-2 may form a second memory deck. In some embodiments, the conductor material is deposited by at least one of CVD, PVD, and ALD. Optionally, etch mask 250-3 may be removed.

Referring back to FIG. 3C, after the formation of the conductor layers, a source structure is formed in each slit opening (Operation 328). FIG. 2K illustrates a corresponding structure.

As shown in FIG. 2K, source structure 218 may be formed in slit opening 234. Source structure 218 may include an insulating spacer 218-1 in slit opening 234 and a source contact 218-2 in insulating spacer 218-1. In some embodiments, a doped region 219 is formed in substrate 202 at the bottom of slit opening 234. In some embodiments, source contact 218-2 is in contact with and conductively connected with doped region 219. Source structure 218 may be formed by joint connection of source portions in adjacent memory decks (e.g., first and second memory decks). Following the shape of slit opening 234, source structure 218 may have a staggered portion at the interface of adjacent memory decks (e.g., the first and second memory decks). In some embodiments, insulating spacer 218-1 includes silicon oxide and source contacts 218-2 include one or more of tungsten, polysilicon, silicides, doped silicon, aluminum, cobalt, and copper. Insulating spacer 218-1 may each be deposited by one or more of CVD, PVD, and ALD, and source contacts 218-2 may each be deposited by one or more of CVD, PVD, ALD, and electroplating. Doped region 219 may be formed by ion implantation. Optionally, a planarization process, e.g., CMP and/or recess etch, is performed to remove any excess material (e.g., the materials for forming source structure 218) over stack structure 220.

Although not described in detail, stack structure 220 may have a staircase structure. The staircase structure can be formed by separately etching each dielectric deck 220-1/220-2 (e.g., the etching of the two dielectric decks are separated by other fabrication processes such as the formation of other structures) or etching stack structure 220 in one etching process. In either case, the staircase structure can be formed by repetitively etching the plurality of interleaved first dielectric layers and second dielectric layers using an etch mask, e.g., a patterned PR layer over the respective dielectric deck/stack structure. Each first dielectric layer and the underlying second dielectric layer may be referred to as a dielectric pair. In some embodiments, one or more dielectric pairs can form one level/stair. During the formation of the staircase structure, the PR layer is trimmed (e.g., etched incrementally and inwardly from the boundary of the stack structure, often from all directions) and used as the etch mask for etching the exposed portion of the dielectric deck/stack structure. The amount of trimmed PR can be directly related (e.g., determinant) to the dimensions of the stairs. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the first dielectric layer and the underlying second dielectric layer. The etched first dielectric layers and second dielectric layers may form stairs in the respective dielectric deck/stack structure. The PR layer can then be removed.

The formation of the staircase structure may occur in any suitable stage of the fabrication process. In some embodiments, the staircase structure is formed by separately etching first dielectric deck 220-1 and second dielectric deck 220-2. The etching of first dielectric deck 220-1 may be performed at any suitable stage after the deposition of first dielectric deck 220-1 (e.g., stage illustrated in FIG. 2A) and before the deposition of second dielectric deck 220-2 (e.g., stage illustrated in FIG. 2C). The etching of second dielectric deck 220-2 may be performed at any suitable stage after the deposition of second dielectric deck 220-2 (e.g., stage illustrated in FIG. 2D). In some embodiments, the staircase structure is formed by etching stack structure 220 in one etching process. For example, the etching may be performed at any suitable stage after the deposition of second dielectric deck 220-2 (e.g., stage illustrated in FIG. 2D). The specific order/timing to form the staircase structure should not be limited by the embodiments of the present disclosure.

In some embodiments, a 3D memory device includes a substrate, an alternating layer stack on the substrate, and a barrier structure extending vertically through the alternating layer stack. The alternating layer stack includes (i) an alternating dielectric stack comprising a plurality of dielectric layer pairs enclosed laterally by at least the barrier structure, and (ii) an alternating conductor/dielectric stack comprising a plurality of conductor/dielectric layer pairs. In some embodiments, the 3D memory device also includes a channel structure and a source structure each extending vertically through the alternating conductor/dielectric stack and a contact structure extending vertically through the alternating dielectric stack. The source structure comprises at least one staggered portion along a respective sidewall.

In some embodiments, the contact structure includes at least one staggered portion along a respective sidewall. The at least one staggered portion of the channel structure and the at least one staggered portion of the contact structure are at same vertical elevation.

In some embodiments, the barrier structure includes silicon oxide, silicon nitride, or a combination thereof.

In some embodiments, each of the plurality of dielectric layer pairs includes a silicon oxide layer and a silicon nitride layer, and each of the plurality of conductor/dielectric layer pairs includes a metal layer and a silicon oxide layer.

In some embodiments, a method for forming a 3D memory device includes the following operations. First, on a substrate, a first dielectric deck is formed to include a plurality of dielectric layer pairs, each of the plurality of dielectric layer pairs having a first dielectric layer and a second dielectric layer different from the first dielectric layer. A first slit opening portion is formed extending vertically through the first dielectric deck. A slit-sacrificial portion is in the first slit opening portion. On the first dielectric deck, a second dielectric deck is formed to include another plurality of dielectric layer pairs, each of the other plurality of dielectric layer pairs comprising another first dielectric layer and another second dielectric layer different from the other first dielectric layer. Further, a second slit opening portion is formed extending vertically through the second dielectric deck, the second slit opening portion exposing the slit-sacrificial portion. The slit-sacrificial portion is removed, the first slit opening portion and the second slit opening portion forming a slit opening. Further, a source structure is formed in the slit opening.

In some embodiments, the method further includes the following operations. First, a first channel hole portion is formed extending vertically through the first dielectric deck. In a same process, the slit-sacrificial portion and a channel-sacrificial portion in the first channel hole portion are formed. In a same process, the second slit opening portion and a second channel hole portion extending vertically through the second dielectric deck are formed. The second channel hole portion exposes the channel-sacrificial portion. The channel-sacrificial portion is removed. The second channel hole portion and the first channel hole portion form a channel hole. A channel structure is formed in the channel hole.

In some embodiments, the method further includes forming, in a same process, another slit-sacrificial portion in the second slit opening portion to be in contact with the slit-sacrificial portion and another channel-sacrificial portion in the second channel hole portion to be in contact with the channel-sacrificial portion. In some embodiments, the method further includes removing the other slit-sacrificial portion in the same process that removes the slit-sacrificial portion and removing the other channel-sacrificial portion in the same process that removes the channel-sacrificial portion to form the channel hole.

In some embodiments, forming the channel-sacrificial portion and the slit-sacrificial portion include depositing a conductive material to fill in the first channel hole portion and the first slit opening portion in a same deposition process. In some embodiments, forming the other channel-sacrificial portion and the other slit-sacrificial portion include depositing another conductive material to fill in the second channel hole portion and the second slit opening portion in a same deposition process.

In some embodiments, the method further includes forming an etch mask that covers the other slit-sacrificial portion and the slit-sacrificial portion during the removal of the channel-sacrificial portion and the other channel-sacrificial portion and during a formation of the channel structure.

In some embodiments, the method further includes forming a conductive plug structure in contact with the substrate in the first channel hole portion after a formation of the first channel hole portion and before a formation of the first slit opening portion.

In some embodiments, the method further includes forming a first contact opening portion and a first barrier opening portion each vertically extending through the first dielectric deck in a same process that forms the first slit opening portion. The first barrier opening portion encloses the first contact opening portion and an inside portion the first dielectric deck.

In some embodiments, the method further includes depositing the conductive material to fill in the first contact opening portion and the first barrier opening portion in the same deposition process that fills up the first channel hole portion and the first slit opening portion to form a first contact portion in the first contact opening portion and a barrier-sacrificial portion in the first barrier opening portion.

In some embodiments, the method further includes forming the second dielectric deck to cover the first contact portion and the barrier-sacrificial portion.

In some embodiments, the method further includes forming, by the same process that forms the second channel hole portion and the second slit opening portion, a second contact opening portion and a second barrier opening portion each extending vertically through the second dielectric deck. The second contact opening portion exposes the first contact portion and the second barrier opening portion exposes the barrier-sacrificial portion. The second barrier opening portion encloses the second contact opening portion and a portion of the second dielectric deck.

In some embodiments, the method further includes depositing, by the same process that fills up the second channel hole portion and the second slit opening portion, the other conductive material to fill in the second contact opening portion and the second barrier opening portion. A second contact portion in the second contact opening portion and in contact with the first contact portion is formed, and another barrier-sacrificial portion in the second barrier opening portion is formed.

In some embodiments, the method further includes removing the barrier-sacrificial portion and the other barrier-sacrificial portion in the same process that removes the channel-sacrificial portion and the other channel-sacrificial portion. The first barrier opening portion and the second barrier opening portion form a barrier opening.

In some embodiments, the method further includes filling the barrier opening with a channel-forming layer by the same process that forms the channel structure to form a barrier structure.

In some embodiments, the method further includes forming another etch mask that covers the second contact portion and the first contact portion during the removal of the barrier-sacrificial portion and the other barrier-sacrificial portion, a formation of the barrier structure, and a formation of the slit opening.

In some embodiments, the method further includes, before a formation of the source structure, removing, through the slit opening, the second dielectric layers in an outside portion of the first dielectric deck and the other second dielectric layers in an outside portion of the second dielectric deck to form a plurality of lateral recesses. In some embodiments, the method further includes, before a formation of the source structure, depositing, through the slit opening, a conductor material to form a plurality of conductor layers in the plurality of lateral recesses.

In some embodiments, a method for forming a 3D memory device includes the following operations. First, on a substrate, a first dielectric deck is formed to include a plurality of dielectric layer pairs, each of the plurality of dielectric layer pairs having a first dielectric layer and a second dielectric layer different from the first dielectric layer. A channel-sacrificial portion, a slit-sacrificial portion, a first contact portion, and a barrier-sacrificial portion are formed to each extend vertically through the first dielectric deck. The first barrier portion encloses the first contact portion and an inside portion the first dielectric deck. On the first dielectric deck, a second dielectric deck is formed to include another plurality of dielectric layer pairs, each of the other plurality of dielectric layer pairs having another first dielectric layer and another second dielectric layer different from the other first dielectric layer. Another channel-sacrificial portion, another slit-sacrificial portion, a second contact portion, and another barrier-sacrificial portion are formed to each extend vertically through the first dielectric deck. Further, the channel-sacrificial portion and the other channel-sacrificial portion are replaced with a channel structure, the slit-sacrificial portion and the other slit-sacrificial portion are replaced with a source structure, and the barrier-sacrificial portion and the other barrier-sacrificial portion are replaced with a barrier structure.

In some embodiments, the method further includes forming a first channel hole portion, a first slit opening portion, a first contact opening portion, and a first barrier opening portion each extending vertically through the first dielectric deck before a formation of the channel-sacrificial portion, the slit-sacrificial portion, the first contact portion, and the barrier-sacrificial portion. The first barrier opening portion encloses the first contact opening portion and the inside portion the first dielectric deck.

In some embodiments, the method further includes forming a second channel hole portion, a second slit opening portion, a second contact opening portion, and a second barrier opening portion each extending vertically through the second dielectric deck before a formation of the other channel-sacrificial portion, the other slit-sacrificial portion, the second contact portion, and the other barrier-sacrificial portion. The second channel hole portion exposes the channel-sacrificial portion, the second slit opening portion exposes the slit-sacrificial portion, the second contact opening portion exposes the first contact portion, and the second barrier opening portion exposes the barrier-sacrificial portion. The other channel-sacrificial portion is formed in the first channel hole portion, the other slit-sacrificial portion is formed in the first slit opening portion, the second contact portion is formed in the second contact opening portion, and the other barrier-sacrificial portion is formed in the second barrier opening portion.

In some embodiments, forming the channel-sacrificial portion, the slit-sacrificial portion, the first contact portion, and the barrier-sacrificial portion include depositing, in a same process, a conductive material to fill in the first channel hole portion, the first slit opening portion, the first contact opening portion, and the first barrier opening portion. In some embodiments, forming the other channel-sacrificial portion, the other slit-sacrificial portion, the second contact portion, and the other barrier-sacrificial portion include depositing, in a same process, another conductive material to fill in the second channel hole portion, the second slit opening portion, the second contact opening portion, and the second barrier opening portion.

In some embodiments, replacing the channel-sacrificial portion and the other channel-sacrificial portion with a channel structure, and the barrier-sacrificial portion and the other barrier-sacrificial portion with a barrier structure include the following operations. An etch mask is formed to cover the other slit-sacrificial portion, the slit-sacrificial portion, the contact structure, and the second contact portion, and exposes the other channel-sacrificial portion and the other barrier-sacrificial portion. In a same process, remove the channel-sacrificial portion, the other channel-sacrificial portion, the barrier-sacrificial portion, and the other barrier-sacrificial portion. The first channel hole portion and the second channel hole portion form a channel hole, the first barrier opening portion and the second barrier opening portion form a barrier opening. In a same process, deposit a plurality of channel-forming layers to fill in the channel hole and the barrier opening.

In some embodiments, replacing the slit-sacrificial portion and the other slit-sacrificial portion with a source structure include forming another etch mask that covers the second contact portion and removing a portion of the etch mask that covers the other slit structure, and removing the slit-sacrificial portion and the other slit-sacrificial portion. The first slit opening portion and the second slit opening portion form a slit opening. In some embodiments, replacing the slit-sacrificial portion and the other slit-sacrificial portion with a source structure also include forming the source structure in the slit opening.

In some embodiments, the method further includes, before a formation of the source structure and after a formation of the slit opening, removing, through the slit opening, the second dielectric layers in an outside portion of the first dielectric deck and the other second dielectric layers in an outside portion of the second dielectric deck to form a plurality of lateral recesses. In some embodiments, the method further includes depositing, through the slit opening, a conductor material to form a plurality of conductor layers in the plurality of lateral recesses.

In some embodiments, the method further includes forming a conductive plug structure in contact with the substrate in the first channel hole portion after a formation of the first channel hole portion and before a formation of the first slit opening portion, the first contact opening portion, and the first barrier opening portion.

In some embodiments, the first slit structure, the first barrier opening portion, and the first contact opening portion are formed in a same process. In some embodiments, the first slit structure, the first barrier opening portion, the first contact opening portion, and the second channel hole portion are formed in a same process.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming, on a substrate, a first dielectric deck comprising a plurality of dielectric layer pairs, each of the plurality of dielectric layer pairs comprising a first dielectric layer and a second dielectric layer different from the first dielectric layer;
   forming a first slit opening portion extending vertically through the first dielectric deck;
   forming a slit-sacrificial portion in the first slit opening portion;
   forming, on the first dielectric deck, a second dielectric deck comprising another plurality of dielectric layer pairs, each of the other plurality of dielectric layer pairs comprising another first dielectric layer and another second dielectric layer different from the other first dielectric layer;
   forming a second slit opening portion extending vertically through the second dielectric deck, the second slit opening portion exposing the slit-sacrificial portion;
   removing the slit-sacrificial portion, the first slit opening portion and the second slit opening portion forming a slit opening; and
   forming a source structure in the slit opening.

2. The method of claim 1, further comprising:
   forming a first channel hole portion extending vertically through the first dielectric deck;
   forming, in a same process, the slit-sacrificial portion and a channel-sacrificial portion in the first channel hole portion;
   forming, in a same process, the second slit opening portion and a second channel hole portion extending vertically through the second dielectric deck, the second channel hole portion exposing the channel-sacrificial portion;
   removing the channel-sacrificial portion, the second channel hole portion and the first channel hole portion forming a channel hole; and
   forming a channel structure in the channel hole.

3. The method of claim 2, further comprising:
   forming, in a same process, another slit-sacrificial portion in the second slit opening portion to be in contact with the slit-sacrificial portion and another channel-sacrificial portion in the second channel hole portion to be in contact with the channel-sacrificial portion;
   removing the other slit-sacrificial portion in the same process that removes the slit-sacrificial portion; and
   removing the other channel-sacrificial portion in the same process that removes the channel-sacrificial portion to form the channel hole.

4. The method of claim 3, wherein
   forming the channel-sacrificial portion and the slit-sacrificial portion comprise depositing a conductive material to fill in the first channel hole portion and the first slit opening portion in a same deposition process; and
   forming the other channel-sacrificial portion and the other slit-sacrificial portion comprise depositing another conductive material to fill in the second channel hole portion and the second slit opening portion in a same deposition process.

5. The method of claim 4, further comprising forming a conductive plug structure in contact with the substrate in the first channel hole portion after a formation of the first channel hole portion and before a formation of the first slit opening portion.

6. The method of claim 5, further comprising forming a first contact opening portion and a first barrier opening portion each vertically extending through the first dielectric deck in a same process that forms the first slit opening portion, wherein the first barrier opening portion encloses the first contact opening portion and an inside portion the first dielectric deck.

7. The method of claim 6, further comprising depositing the conductive material to fill in the first contact opening portion and the first barrier opening portion in the same deposition process that fills up the first channel hole portion and the first slit opening portion to form a first contact portion in the first contact opening portion and a barrier-sacrificial portion in the first barrier opening portion.

8. The method of claim 7, further comprising forming, by the same process that forms the second channel hole portion and the second slit opening portion, a second contact opening portion and a second barrier opening portion each extending vertically through the second dielectric deck, wherein
   the second contact opening portion exposes the first contact portion and the second barrier opening portion exposes the barrier-sacrificial portion; and
   the second barrier opening portion encloses the second contact opening portion and a portion of the second dielectric deck.

9. The method of claim 8, further comprising depositing, by the same process that fills up the second channel hole portion and the second slit opening portion, the other conductive material to fill in the second contact opening portion and the second barrier opening portion, forming a second contact portion in the second contact opening portion and in contact with the first contact portion, and another barrier-sacrificial portion in the second barrier opening portion.

10. The method of claim 9, further comprising removing the barrier-sacrificial portion and the other barrier-sacrificial portion in the same process that removes the channel-sacrificial portion and the other channel-sacrificial portion, the first barrier opening portion and the second barrier opening portion forming a barrier opening.

11. The method of claim 10, further comprising filling the barrier opening with a channel-forming layer by the same process that forms the channel structure to form a barrier structure.

12. The method of claim 3, further comprising forming an etch mask that covers the other slit-sacrificial portion and the slit-sacrificial portion during the removal of the channel-sacrificial portion and the other channel-sacrificial portion and during a formation of the channel structure.

13. A method for forming a three-dimensional (3D) memory device, comprising:
  forming, on a substrate, a first dielectric deck comprising a plurality of dielectric layer pairs, each of the plurality of dielectric layer pairs comprising a first dielectric layer and a second dielectric layer different from the first dielectric layer;
  forming a channel-sacrificial portion, a slit-sacrificial portion, a first contact portion, and a barrier-sacrificial portion each extending vertically through the first dielectric deck, wherein the first barrier portion encloses the first contact portion and an inside portion the first dielectric deck;
  forming, on the first dielectric deck, a second dielectric deck comprising another plurality of dielectric layer pairs, each of the other plurality of dielectric layer pairs comprising another first dielectric layer and another second dielectric layer different from the other first dielectric layer;
  forming another channel-sacrificial portion, another slit-sacrificial portion, a second contact portion, and another barrier-sacrificial portion each extending vertically through the first dielectric deck; and
  replacing the channel-sacrificial portion and the other channel-sacrificial portion with a channel structure, the slit-sacrificial portion and the other slit-sacrificial portion with a source structure, and the barrier-sacrificial portion and the other barrier-sacrificial portion with a barrier structure.

14. The method of claim 13, further comprising forming a first channel hole portion, a first slit opening portion, a first contact opening portion, and a first barrier opening portion each extending vertically through the first dielectric deck before a formation of the channel-sacrificial portion, the slit-sacrificial portion, the first contact portion, and the barrier-sacrificial portion, wherein the first barrier opening portion encloses the first contact opening portion and the inside portion the first dielectric deck.

15. The method of claim 14, further comprising forming a second channel hole portion, a second slit opening portion, a second contact opening portion, and a second barrier opening portion each extending vertically through the second dielectric deck before a formation of the other channel-sacrificial portion, the other slit-sacrificial portion, the second contact portion, and the other barrier-sacrificial portion, wherein:
  the second channel hole portion exposes the channel-sacrificial portion, the second slit opening portion exposes the slit-sacrificial portion, the second contact opening portion exposes the first contact portion, and the second barrier opening portion exposes the barrier-sacrificial portion, and
  the other channel-sacrificial portion is formed in the first channel hole portion, the other slit-sacrificial portion is formed in the first slit opening portion, the second contact portion is formed in the second contact opening portion, and the other barrier-sacrificial portion is formed in the second barrier opening portion.

16. The method of claim 15, wherein
  forming the channel-sacrificial portion, the slit-sacrificial portion, the first contact portion, and the barrier-sacrificial portion comprise depositing, in a same process, a conductive material to fill in the first channel hole portion, the first slit opening portion, the first contact opening portion, and the first barrier opening portion; and
  forming the other channel-sacrificial portion, the other slit-sacrificial portion, the second contact portion, and the other barrier-sacrificial portion comprise depositing, in a same process, another conductive material to fill in the second channel hole portion, the second slit opening portion, the second contact opening portion, and the second barrier opening portion.

17. The method of claim 16, wherein replacing the channel-sacrificial portion and the other channel-sacrificial portion with a channel structure, and the barrier-sacrificial portion and the other barrier-sacrificial portion with a barrier structure comprises:
  forming an etch mask that covers the other slit-sacrificial portion, the slit-sacrificial portion, the contact structure, and the second contact portion, and exposes the other channel-sacrificial portion and the other barrier-sacrificial portion;
  removing, in a same process, the channel-sacrificial portion, the other channel-sacrificial portion, the barrier-sacrificial portion, and the other barrier-sacrificial portion, the first channel hole portion and the second channel hole portion forming a channel hole, the first barrier opening portion and the second barrier opening portion forming a barrier opening; and
  depositing, in a same process, a plurality of channel-forming layers to fill in the channel hole and the barrier opening.

* * * * *